US010763083B2

(12) United States Patent
Yang et al.

(10) Patent No.: US 10,763,083 B2
(45) Date of Patent: Sep. 1, 2020

(54) HIGH ENERGY ATOMIC LAYER ETCHING

(71) Applicant: Lam Research Corporation, Fremont, CA (US)

(72) Inventors: Wenbing Yang, Fremont, CA (US); Samantha Tan, Fremont, CA (US); Tamal Mukherjee, Fremont, CA (US); Keren Jacobs Kanarik, Los Altos, CA (US); Yang Pan, Los Altos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 16/148,939

(22) Filed: Oct. 1, 2018

(65) Prior Publication Data
US 2019/0108982 A1     Apr. 11, 2019

Related U.S. Application Data

(60) Provisional application No. 62/599,613, filed on Dec. 15, 2017, provisional application No. 62/569,443, filed on Oct. 6, 2017.

(51) Int. Cl.
*H01L 21/3065*     (2006.01)
*H01L 21/3213*     (2006.01)
(Continued)

(52) U.S. Cl.
CPC ...... *H01J 37/32449* (2013.01); *H01J 37/321* (2013.01); *H01J 37/32155* (2013.01);
(Continued)

(58) Field of Classification Search
None
See application file for complete search history.

(56) References Cited

U.S. PATENT DOCUMENTS

| 3,798,056 A | 3/1974 | Okinaka et al. |
| 6,143,082 A | 11/2000 | McInerney et al. |
| (Continued) | | |

FOREIGN PATENT DOCUMENTS

| CN | 1552097 A | 12/2004 |
| CN | 1675517 A | 9/2005 |
| (Continued) | | |

OTHER PUBLICATIONS

Kanarik et al. (2017) "Predicting synergy in atomic layer etching," J. Vac. Sci. Technol. A 3515V05C302-1 through 05C302-7 (Year: 2017).*

(Continued)

*Primary Examiner* — Shamim Ahmed
(74) *Attorney, Agent, or Firm* — Weaver Austin Villeneuve & Sampson LLP

(57) ABSTRACT

Methods and apparatus for performing high energy atomic layer etching are provided herein. Methods include providing a substrate having a material to be etched, exposing a surface of the material to a modification gas to modify the surface and form a modified surface, and exposing the modified surface to an energetic particle to preferentially remove the modified surface relative to an underlying unmodified surface where the energetic particle has an ion energy sufficient to overcome an average surface binding energy of the underlying unmodified surface. The energy of the energetic particle used is very high; in some cases, the power applied to a bias used when exposing the modified surface to the energetic particle is at least 150 eV.

22 Claims, 23 Drawing Sheets

(51) Int. Cl.
*H01J 37/32* (2006.01)
*H01L 29/66* (2006.01)

(52) U.S. Cl.
CPC .... *H01J 37/32174* (2013.01); *H01L 21/3065* (2013.01); *H01L 21/32136* (2013.01); *H01L 21/32137* (2013.01); *H01L 29/66795* (2013.01); *H01J 2237/334* (2013.01)

(56) References Cited

U.S. PATENT DOCUMENTS

| | | |
|---|---|---|
| 6,448,192 B1 | 9/2002 | Kaushik |
| 6,635,965 B1 | 10/2003 | Lee et al. |
| 6,713,122 B1 | 3/2004 | Mayer et al. |
| 6,841,943 B2 | 1/2005 | Vahedi et al. |
| 6,844,258 B1 | 1/2005 | Fair et al. |
| 7,005,372 B2 | 2/2006 | Levy et al. |
| 7,141,494 B2 | 11/2006 | Lee et al. |
| 7,589,017 B2 | 9/2009 | Chan et al. |
| 7,690,324 B1 | 4/2010 | Feng et al. |
| 7,772,114 B2 | 8/2010 | Chan et al. |
| 7,955,972 B2 | 6/2011 | Chan et al. |
| 8,058,170 B2 | 11/2011 | Chandrashekar et al. |
| 8,124,531 B2 | 2/2012 | Chandrashekar et al. |
| 8,551,885 B2 | 10/2013 | Chen et al. |
| 8,552,334 B2 | 10/2013 | Tappan et al. |
| 8,622,020 B2 | 1/2014 | Thie et al. |
| 8,728,956 B2 | 5/2014 | LaVoie |
| 8,883,028 B2 * | 11/2014 | Kanarik ............ H01J 37/32082 216/68 |
| 9,048,088 B2 | 6/2015 | Kolics et al. |
| 9,355,839 B2 | 5/2016 | Swaminathan et al. |
| 9,362,133 B2 | 6/2016 | Shamma et al. |
| 9,362,163 B2 | 6/2016 | Danek et al. |
| 9,576,811 B2 | 2/2017 | Kanarik et al. |
| 9,620,376 B2 | 4/2017 | Kamp et al. |
| 9,805,941 B2 | 10/2017 | Kanarik et al. |
| 9,806,252 B2 | 10/2017 | Tan et al. |
| 9,870,899 B2 | 1/2018 | Yang et al. |
| 9,972,504 B2 | 5/2018 | Lai et al. |
| 9,991,128 B2 | 6/2018 | Tan et al. |
| 9,997,371 B1 | 6/2018 | Agarwal et al. |
| 10,056,264 B2 | 8/2018 | Yang et al. |
| 10,096,487 B2 | 10/2018 | Yang et al. |
| 10,186,426 B2 | 1/2019 | Tan et al. |
| 10,269,566 B2 | 4/2019 | Tan et al. |
| 10,374,144 B2 | 8/2019 | Tan et al. |
| 10,494,715 B2 | 12/2019 | Agarwal et al. |
| 10,515,816 B2 | 12/2019 | Kanarik et al. |
| 10,566,212 B2 | 2/2020 | Kanarik et al. |
| 10,566,213 B2 | 2/2020 | Kanarik et al. |
| 2002/0081381 A1 | 6/2002 | DelaRosa et al. |
| 2010/0190341 A1 | 7/2010 | Park et al. |
| 2011/0139748 A1 | 6/2011 | Donnelly et al. |
| 2011/0256734 A1 | 10/2011 | Hausmann et al. |
| 2013/0129922 A1 | 5/2013 | Sasagawa et al. |
| 2013/0137267 A1 | 5/2013 | Chang et al. |
| 2014/0170853 A1 | 6/2014 | Shamma et al. |
| 2014/0349469 A1 | 11/2014 | Sasagawa et al. |
| 2015/0228495 A1 * | 8/2015 | Joubert ............ H01L 21/67069 438/714 |
| 2015/0270140 A1 * | 9/2015 | Gupta ............ H01L 21/32136 216/67 |
| 2015/0345029 A1 | 12/2015 | Wang et al. |
| 2015/0354061 A1 | 12/2015 | Dhas et al. |
| 2016/0099133 A1 | 4/2016 | Kanarik |
| 2016/0203995 A1 * | 7/2016 | Kanarik ............ H01L 21/0228 438/703 |
| 2016/0358782 A1 * | 12/2016 | Yang ............ H01L 21/30621 |
| 2016/0381060 A1 | 12/2016 | Floering |
| 2017/0040214 A1 | 2/2017 | Lai et al. |
| 2017/0053808 A1 | 2/2017 | Kamp et al. |
| 2017/0053810 A1 | 2/2017 | Yang et al. |
| 2017/0069462 A1 | 3/2017 | Kanarik et al. |
| 2017/0117159 A1 | 4/2017 | Kanarik et al. |
| 2018/0005850 A1 * | 1/2018 | Citla ............ H01L 21/67069 |
| 2018/0033635 A1 | 2/2018 | Kanarik et al. |
| 2018/0174860 A1 | 6/2018 | Kanarik |
| 2018/0182634 A1 * | 6/2018 | Smith ............ H01J 37/32422 |
| 2018/0308680 A1 | 10/2018 | Reddy et al. |
| 2018/0308695 A1 | 10/2018 | LaVoie et al. |
| 2018/0337046 A1 | 11/2018 | Shamma et al. |
| 2018/0350624 A1 | 12/2018 | Kanarik et al. |
| 2019/0139778 A1 | 5/2019 | Kanarik et al. |
| 2019/0244805 A1 | 8/2019 | Tan et al. |

FOREIGN PATENT DOCUMENTS

| | | |
|---|---|---|
| CN | 101809711 A | 8/2010 |
| JP | H03-133128 A | 6/1991 |
| JP | 2010283357 A | 12/2010 |
| JP | 5416280 B2 | 11/2013 |
| JP | 2013235912 A | 11/2013 |
| TW | 201140687 A | 11/2011 |
| TW | 201340209 A | 10/2013 |
| WO | WO2011/081921 A2 | 7/2011 |
| WO | WO2016/160778 A1 | 10/2016 |
| WO | WO2017/099718 A1 | 6/2017 |

OTHER PUBLICATIONS

Office Action dated Jun. 17, 2016 issued in U.S. Appl. No. 14/696,254.
Notice of Allowance dated Oct. 14, 2016 issued in U.S. Appl. No. 14/696,254.
Notice of Allowance dated Jun. 29, 2017 issued in U.S. Appl. No. 15/400,368.
Office Action dated Mar. 29, 2018 issued in U.S. Appl. No. 15/719,484.
Notice of Allowance dated Sep. 11, 2018 issued in U.S. Appl. No. 15/719,484.
Office Action dated May 31, 2019 issued in U.S. Appl. No. 16/220,583.
Notice of Allowance dated Aug. 21, 2019 issued in U.S. Appl. No. 16/220,583.
International Search Report and Written Opinion dated Jun. 28, 2019 issued in Application No. PCT/US2019/022520.
International Search Report and Written Opinion dated Feb. 1, 2019 issued in Application No. PCT/US2018/054001.
Chinese First Office Action dated Dec. 27, 2017 issued in Application No. CN 201610017911.4.
Chinese Second Office Action dated Aug. 31, 2018 issued in Application No. CN 201610017911.4.
Chinese Third Office Action dated Mar. 4, 2019 issued in Application No. CN 201610017911.4.
Chinese Fourth Office Action dated Sep. 29, 2019 issued in Application No. CN 201610017911.4.
Chinese First Office Action dated Aug. 5, 2019 issued in Application No. CN 201810642746.0.
Singapore Search Report and Written Opinion dated Jun. 14, 2018 issued in Application No. SG 10201600099V.
Taiwan First Office Action dated Jul. 18, 2019 issued in Application No. TW 105100640.
Japanese First Office Action dated Jan. 28, 2020 issued in Application No. JP 2016-002141.
Kanarik et al., [webpage] "Tech Brief: All About ALE," Nov. 2016, pp. 1-3. <URL:https://blog.lamresearch.com/tech-brief-all-about-ale/>.
Happich, J., [webpage] "Atomic layer etching yields 2.5nm wide FinFETs," eeNews Europe, Dec. 10, 2018, pp. 4. [retrieved Dec. 12, 2018 <URL:http://www.eenewseurope.com/news/atomic-layer-etching-yields-25nm-wide-finfets/page/0/1>.
Kanarik et al., "Overview of atomic layer etching in the semiconductor industry," Journal of Vacuum Science & Technology A, vol. 33, No. 2, Mar. 5, 2015, pp. 1-14. <doi:10.1116/1.4913379>.
Kanarik et al., "Atomic Layer Etching: Rethinking the Art of Etch," Journal of Physical Chemistry Letters, vol. 9, Aug. 10, 2018, pp. 4814-4821.

* cited by examiner

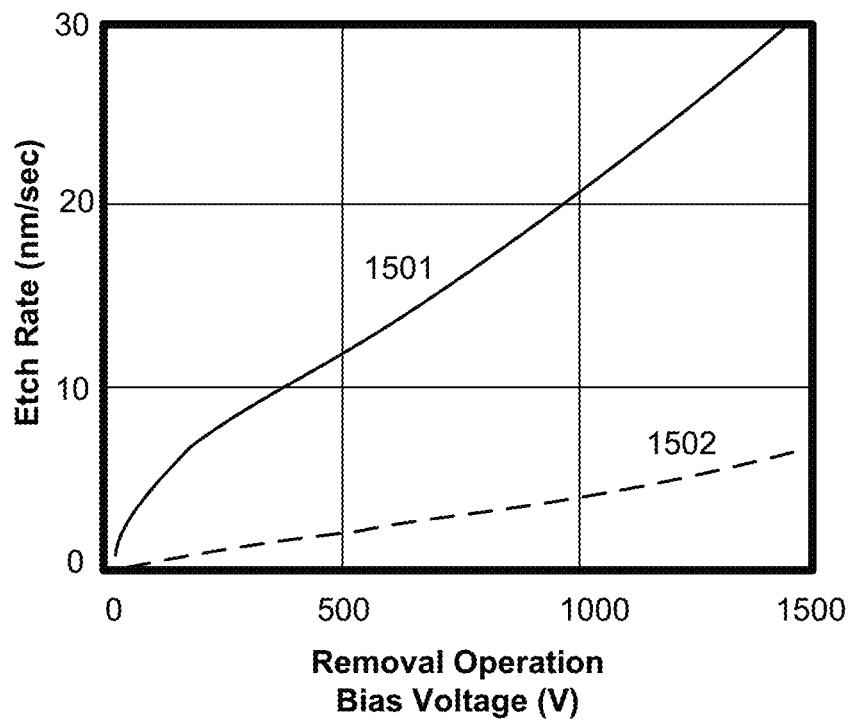
FIG. 15
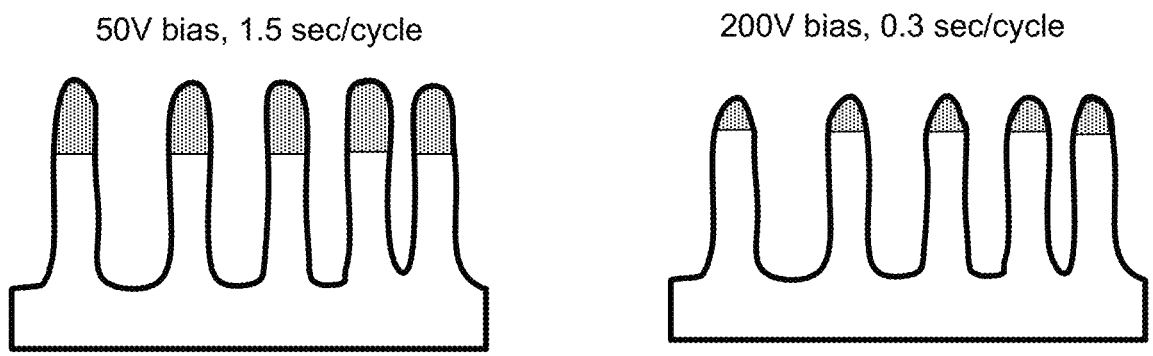
FIG. 16A
FIG. 16B

HIGH ENERGY ATOMIC LAYER ETCHING

CROSS-REFERENCE TO RELATED APPLICATION

This application claims benefit of U.S. Provisional Patent Application No. 62/569,443, filed Oct. 6, 2017, and titled "PULSING ATOMIC LAYER ETCHING," and U.S. Provisional Patent Application No. 62/599,613, filed Dec. 15, 2017, and titled "HIGH ENERGY ATOMIC LAYER ETCHING," which are incorporated by reference herein in their entireties and for all purposes.

BACKGROUND

Semiconductor fabrication processes include etching of various materials. As three dimensional structures shrink towards a sub-10 nm node, traditional etching processes face unprecedented challenges. For example, pitch loading becomes a concern as the etch rate is affected by the increasing aspect ratio. The challenges associated with the transport of neutrals and ions to the etch front, the surface reaction rate at etch fronts, and etch product removal from the etch front become prominent as devices shrink.

SUMMARY

Provided herein are methods and apparatuses for performing high energy atomic layer etching. One aspect involves a method of processing a substrate, the method including: providing a substrate including a material to be etched; exposing a surface of the material to be etched to a modification gas to modify the surface and for a modified surface; and exposing the modified surface to an energetic particle to preferentially remove the modified surface relative to an underlying unmodified surface, the energetic particle having an ion energy sufficient to overcome an average surface binding energy of the underlying unmodified surface.

In various embodiments, the ion energy of the energetic particle is sufficient to break bonds of the underlying unmodified surface. The energetic particle may be delivered in temporally separated doses having a duty cycle between about 1% and about 10%.

In various embodiments, a bias voltage is applied to a substrate support holding the substrate during the exposing the modified surface to the energetic particle.

In some embodiments, the energetic particle removes an amount of the modified surface, and the amount of the removed modified surface is given by the equation $$\theta(t) = 1 - \exp\left(\frac{-Y \cdot F \cdot t}{d}\right)$$

such that Y is ion yield of the energetic particle, F is flux of energetic particle, t is the duration of the exposure to the energetic particle, and d is the surface density of material to be etched.

In various embodiments, the energetic particle does not significantly sputter the underlying unmodified material. For example, the modified surface may be exposed to the energetic particle for a duration is sufficient to remove the modified surface in a self-limited manner.

Another aspect involves method of processing a substrate, the method including: providing a substrate including a material to be etched; exposing a surface of the material to be etched to a modification gas to modify the surface and form a modified surface; and applying a bias while exposing the modified surface to an energetic particle to remove the modified surface, such that the power applied to the bias is at least 150 eV.

In various embodiments, the power applied to the bias is at least 500 eV.

Another aspect involves a method of processing a substrate, the method including: providing a substrate including a material to be etched; exposing a surface of the material to be etched to a modification gas to modify the surface and form a modified surface; and delivering a dose of energetic particle to the modified surface to remove the modified surface, such that the dose is insufficient to remove the modified surface when delivered using a bias voltage less than the surface binding energy of the underlying unmodified surface.

Another aspect involves a method of processing a substrate, the method including: providing a substrate including a material to be etched; exposing a surface of the material to be etched to a modification gas to modify the surface and form a modified surface; and exposing the modified surface to an energetic particle to preferentially remove at least 80% of the modified surface relative to an underlying unmodified surface for a duration greater than a duration sufficient to remove the modified surface and the underlying unmodified surface by ion bombardment.

Another aspect involves a method of processing a substrate, the method including: providing a substrate including a material to be etched; exposing a surface of the material to be etched to a modification gas to modify the surface and form a modified surface; and exposing the modified surface to an energetic particle in pulses having a duty cycle of less than 100%.

Another aspect involves a method of processing a substrate, the method including: providing a substrate including a material to be etched; exposing a surface of the material to be etched to a modification gas to modify the surface and form a modified surface; and exposing the modified surface to an attenuated dose of an energetic particle, such that the dose without attenuation has an energy greater than a surface binding energy for the material to be etched when delivered continuously to the modified surface.

In various embodiments, the dose is attenuated by varying the ion flux of the activated species.

In some embodiments, the dose is attenuated by varying the duration of the modified surface being exposed to the activated species.

In various embodiments, the attenuated dose includes two or more temporally separated pulses of the activated species to the modified surface to remove the at least some of the modified surface.

In some embodiments, the dose is attenuated by varying the acceleration of ions in the activated species to the modified surface.

In various embodiments, the dose is attenuated by varying the bias voltage applied to a substrate support holding the substrate for directionally delivering the activated species to the modified surface.

Another aspect involves a method of processing a substrate, the method including: providing a substrate including a material to be etched; exposing a surface of the material to be etched to a modification gas to modify the surface and form a modified surface; and exposing the modified surface to an energetic particle in temporally separated pulses; and modulating the ion energy and dose during the temporally separated pulses. In some embodiments, modulating the ion energy and dose includes increasing the ion energy and compensating the increase of ion energy with reduced dose.

Another aspect involves a method of processing a substrate, the method including: exposing the substrate to a modification gas to modify a surface of the substrate to form a modified surface; exposing the modified surface of the substrate to a removal gas; and providing a plurality of temporally separated pulses of energy generated from an activation source during the exposing the modified surface to the removal gas to remove at least some of the modified surface from the substrate.

In some embodiments, the method also includes repeating exposing the substrate to the modification gas and exposing the modified surface to the removal gas in two or more cycles, such that the plurality of temporally separated pulses of energy is provided during the exposing the modified surface to the removal gas in each cycle.

In various embodiments, the plurality of temporally separated pulses of energy includes at least 100 temporally separated pulses of energy per cycle.

In various embodiments, the temporally separated pulses of energy is sufficient to remove the modified surface and insufficient to physically sputter the modified surface.

In various embodiments, the energy provided is defined by a bias window of a minimum voltage applied to the substrate during the exposure to the removal gas sufficient to remove the modified surface, and a maximum voltage applied to the substrate during the exposure to the removal gas insufficient to sputter the modified surface.

In various embodiments, the plurality of temporally separated pulses of energy are pulsed at a frequency between about 10 Hz and about 200 Hz.

In various embodiments, the plurality of temporally separated pulses of energy are pulsed at a duty cycle between about 1% and about 10%.

In some embodiments, the activation source includes two or more sources.

In some embodiments, the activation source is selected from the group consisting of radio frequency plasma, bias applied to the substrate, ultraviolet radiation, photons, and combinations thereof.

In some embodiments, the activation source includes voltage applied to bias the substrate. The bias voltage may be at least between about 500 V and about 1500 V. The bias may be pulsed between 0V and a bias voltage between about 500V and about 1500V.

In some embodiments, the bias is pulsed between a low bias voltage between about 100V and about 300V and a high bias voltage between about 500V and about 1500V.

In some embodiments, the bias is pulsed using a pulsing frequency between about 10 Hz and about 200 Hz.

In some embodiments, the bias is pulsed using a duty cycle between about 1% and about 20%.

In some embodiments, the activation source includes radio frequency plasma.

In some embodiments, the radio frequency plasma is generated by applying a power and the radio frequency plasma power pulsed between an OFF state where the plasma power is 0 W and an ON state where the plasma power is between about 50 W and about 900 W.

In some embodiments, the radio frequency plasma generated by applying a power and the radio frequency plasma power is pulsed between a low plasma power and a high plasma power, the low plasma power being between about 10 W and about 100 W and the high plasma power being between about 900 W and about 1500 W.

In some embodiments, the radio frequency plasma is pulsed using a pulsing frequency between about 10 Hz and about 200 Hz.

In some embodiments, duty cycle of the radio frequency plasma pulsing is between about 1% and about 20%.

In some embodiments, such that the activation source includes radio frequency plasma and bias applied to the substrate. The bias may be pulsed between 0V and a bias voltage between about 500V and about 1500V. The bias may be pulsed between a low bias voltage between about 100V and about 300V and a high bias voltage between about 500V and about 1500V. The radio frequency plasma may be generated by applying a power and the radio frequency plasma power pulsed between an OFF state where the plasma power is 0 W and an ON state where the plasma power is between about 50 W and about 900 W. The radio frequency plasma may be pulsed between a low plasma power and a high plasma power, the low plasma power being between about 10 W and about 100 W and the high plasma power being between about 900 W and about 1500 W.

In various embodiments, the substrate includes one or more narrow features and one or more wide features.

In some embodiments, the substrate is processed at a substrate temperature between about 0° C. and about 120° C.

In some embodiments, the substrate is processed in a process chamber having a chamber pressure between about 5 mTorr and about 1 Torr during the exposing the substrate to the modification gas.

In some embodiments, the substrate is processed in a process chamber having a chamber pressure between about 5 mTorr and about 200 mTorr during the exposing the substrate to the removal gas.

Another aspect involves a method of processing a substrate, the method including: exposing the substrate to a modification gas to modify a surface of the substrate to form a modified surface; exposing the modified surface of the substrate to a removal gas; and periodically igniting a plasma in two or more temporally separated pulses during the exposing of the modified surface to the removal gas to remove at least some of the modified surface from the substrate.

The method may also include repeating exposing the substrate to the modification gas and exposing the modified surface to the removal gas in two or more cycles, such that the two or more temporally separated pulses of plasma are provided during the exposing the modified surface to the removal gas in each cycle.

In some embodiments, the plurality of temporally separated pulses of plasma comprise at least 100 pulses of energy per cycle.

The method may also include applying a bias in pulses during the exposing of the modified surface to the removal gas. In some embodiments, the method also includes repeating exposing the substrate to the modification gas and exposing the modified surface to the removal gas in two or more cycles, such that the two or more temporally separated pulses of plasma and bias are provided during the exposing the modified surface to the removal gas in each cycle.

In some embodiments, the plurality of temporally separated pulses of plasma and bias comprise at least 100 pulses per cycle, a cycle including exposing the substrate to the modification gas and exposing the modified surface to the removal gas.

In some embodiments, the plasma and bias are pulsed at the same frequency.

In some embodiments, the plasma and bias are pulsed using the same duty cycle.

Another aspect involves a method of processing a substrate, the method including: exposing the substrate to a modification gas to modify a surface of the substrate to form a modified surface; exposing the modified surface of the substrate to a removal gas; igniting a plasma during the exposing of the modified surface; and periodically applying a bias in two or more temporally separate pulses to the substrate during the exposing of the modified surface to the removal gas to remove at least some of the modified surface from the substrate.

The method may also include igniting a plasma in pulses during the exposing of the modified surface to the removal gas.

In some embodiments, the method includes repeating exposing the substrate to the modification gas and exposing the modified surface to the removal gas in two or more cycles, such that the two or more temporally separated pulses of bias power are provided during the exposing the modified surface to the removal gas in each cycle.

In some embodiments, the plurality of temporally separated pulses of bias power comprise at least 100 pulses per cycle, a cycle including exposing the substrate to the modification gas and exposing the modified surface to the removal gas.

Another aspect involves apparatus for processing a substrate, the apparatus including: a process chamber including a showerhead and a substrate support for holding the substrate having a material, a plasma generator, and a controller having at least one processor and a memory, such that the at least one processor and the memory are communicatively connected with one another, the at least one processor is at least operatively connected with flow-control hardware, and the memory stores machine-readable instructions for: causing introduction of a modification gas to the process chamber; causing introduction of a removal gas to the process chamber; and causing an activation source to be pulsed during the introduction of the removal gas.

In some embodiments, the memory further stores machine-readable instructions for causing pulse frequency of the activation source during the introduction of the removal gas to be between about 10 Hz and about 200 Hz.

In some embodiments, the memory further stores machine-readable instructions for causing duty cycle of the activation source during the introduction of the removal gas to be between about 1% and about 10%.

In some embodiments, the activation source is a plasma generated in the process chamber using a plasma power and the memory further stores machine-readable instructions for causing the activation source to pulse between an OFF state where the plasma power is 0 W and an ON state where the plasma power is between about 50 W and about 900 W.

In some embodiments, the activation source is a plasma generated in the process chamber and the memory further stores machine-readable instructions for causing the activation source to pulse between a low plasma power and a high plasma power, the low plasma power being between about 10 W and about 100 W and the high plasma power being between about 900 W and about 1500 W.

In some embodiments, such that the memory further stores machine-readable instructions for causing a bias to be applied to the substrate support in pulses. For example, the memory may also store machine-readable instructions for causing the bias to be pulsed between 0V and a bias voltage between about 500V and about 1500V. In some embodiments, the memory further stores machine-readable instructions for causing the bias to be pulsed at the same pulsing frequency as the activation source. In some embodiments, the memory further stores machine-readable instructions for causing the bias to be pulsed at the same pulsing duty cycle as the activation source.

Another aspect may involve an apparatus for processing a substrate, the apparatus including: a process chamber including a showerhead and a substrate support for holding the substrate having a material, a plasma generator, and a controller having at least one processor and a memory, such that the at least one processor and the memory are communicatively connected with one another, the at least one processor is at least operatively connected with flow-control hardware, and the memory stores machine-readable instructions for: causing introduction of a modification gas to the process chamber; causing introduction of a removal gas to the process chamber; and causing radio frequency plasma power to be generated in the process chamber in two or more temporally separated pulses during the introduction of the removal gas.

In some embodiments, the memory further stores machine-readable instructions for causing pulse frequency of the radio frequency plasma power during the introduction of the removal gas to be between about 10 Hz and about 200 Hz.

In some embodiments, the memory further stores machine-readable instructions for causing duty cycle of the radio frequency plasma power during the introduction of the removal gas to be between about 1% and about 10%.

In some embodiments, the memory further stores machine-readable instructions for causing the radio frequency plasma power to pulse between an OFF state where the plasma power is 0 W and an ON state where the plasma power is between about 50 W and about 900 W.

In some embodiments, the memory further stores machine-readable instructions for causing the radio frequency plasma power to pulse between a low plasma power and a high plasma power, the low plasma power being between about 10 W and about 100 W and the high plasma power being between about 900 W and about 1500 W.

In some embodiments, the memory further stores machine-readable instructions for causing a bias to be applied to the substrate support in pulses.

In some embodiments, the memory further stores machine-readable instructions for causing the bias to be pulsed between 0V and a bias voltage between about 500V and about 1500V.

In some embodiments, the memory further stores machine-readable instructions for causing the bias to be pulsed between a low bias voltage between about 100V and about 300V and a high bias voltage between about 500V and about 1500V.

In some embodiments, the memory further stores machine-readable instructions for causing the bias to be pulsed at the same pulsing frequency as the radio frequency plasma power.

In some embodiments, the memory further stores machine-readable instructions for causing the bias to be pulsed at the same pulsing duty cycle as the radio frequency plasma power.

Another aspect involves an apparatus for processing a substrate, the apparatus including: a process chamber including a showerhead and a substrate support for holding the substrate having a material, a plasma generator, and a controller having at least one processor and a memory, such that the at least one processor and the memory are communicatively connected with one another, the at least one processor is at least operatively connected with flow-control hardware, and the memory stores machine-readable instructions for: causing introduction of a modification gas to the process chamber; causing introduction of a removal gas to the process chamber; and causing bias power to be applied to the substrate support in two or more temporally separated pulses to the substrate during the introduction of the removal gas.

In some embodiments, the memory further stores machine-readable instructions for causing pulse frequency of the bias power during the introduction of the removal gas to be between about 10 Hz and about 200 Hz.

In some embodiments, the memory further stores machine-readable instructions for causing duty cycle of the bias power during the introduction of the removal gas to be between about 1% and about 10%.

In some embodiments, the memory further stores machine-readable instructions for causing the bias power to pulse between an OFF state where the bias power is 0V and an ON state where the bias power is between about 500V and about 1500V.

In some embodiments, the memory further stores machine-readable instructions for causing the bias power to pulse between a low bias power and a high bias power, the low bias power being between about 100V and about 300V and the high bias power being between about 500 V and about 1500V.

In some embodiments, the memory further stores machine-readable instructions for causing a plasma to be ignited by applying a plasma power in pulses during the introduction of the removal gas.

In some embodiments, the memory further stores machine-readable instructions for causing the plasma power to be pulsed between 0 W and a plasma power between about 50 W and about 900 W.

In some embodiments, the memory further stores machine-readable instructions for causing the plasma power to be pulsed at the same pulsing frequency as the bias power.

In some embodiments, the memory further stores machine-readable instructions for causing the plasma power to be pulsed at the same pulsing duty cycle as the bias power.

These and other aspects are further described below in conjunction with the drawings.

BRIEF DESCRIPTION OF THE DRAWINGS

FIG. 15 is a graph of example etch rates for various argon bias voltages for silicon and SiCl.

FIG. 16A is an example drawing of a substrate exposed to 50V argon bias in an experiment.

FIG. 16B is an example drawing of a substrate exposed to 200V argon bias in an experiment.

DETAILED DESCRIPTION

Figure 1:
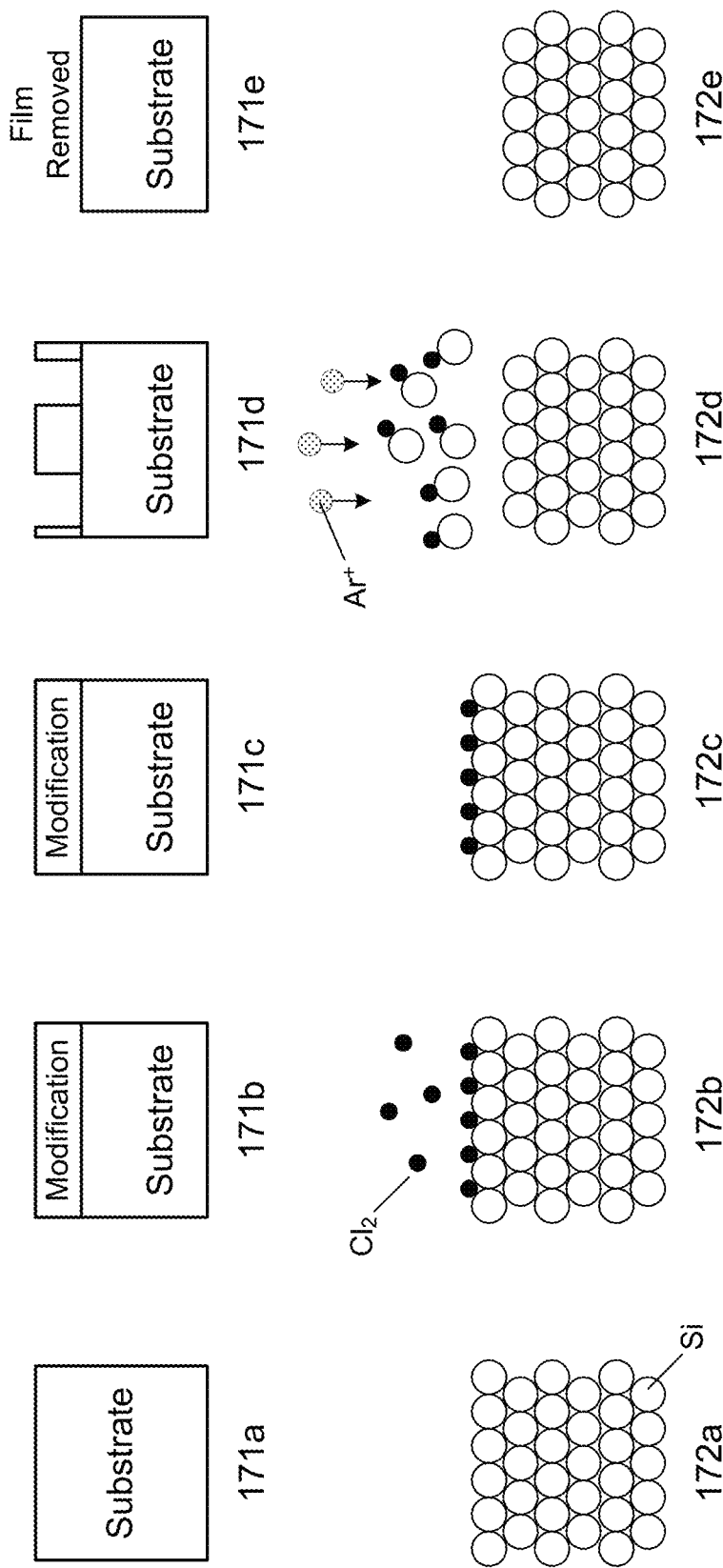
FIG. 1 shows example schematic diagrams of substrates undergoing atomic layer etching.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Semiconductor processing often involves various etching operations. One example technology for processing and forming 3D structures involves reactive ion etch (RIE), which generates directional etch and sidewall passivation. In general, RIE generates reactive species such as halogen-containing species generated from fluorine-containing compounds, chlorine, hydrogen bromide; and ions such as helium and/or argon to use in directional etching, and various species to passivate sidewall surface. However, as etch depths increase, depth loading for features of different aspect ratios occurs, in part due to the species hitting sidewalls of the feature holes as the species are delivered to the bottoms of the features. Depth loading also occurs due to the variety of iso areas (such as features having a wide feature opening) and dense areas (such as features having a narrow feature opening). A feature having a "narrow" opening may be defined as a feature having an opening diameter or line width less than that of a "wide" feature in relative terms. Wide features may have an opening diameter or a critical dimension at least 1.5 times, or at least 2 times, or at least 5 times, or at least 10 times or more than 10 times larger than the critical dimension of narrow features. Examples of "narrow" features include features having an opening diameter between about 1 nm and about 10 nm. Examples of "wide" features include features having an opening diameter on the order of hundreds of nanometers to about 1 micron.

Etching processes often involve exposing a material to be etched to a combination of etching gases to remove the material. However, such removal may not be self-limiting and in some cases may etch more than desired, or result in an undesirable feature profile. As feature sizes shrink, there is a growing need for atomic scale processing such as Atomic Layer Etch (ALE). ALE is a technique that removes thin layers of material using sequential self-limiting reactions in cycles of nominally self-limiting steps that result in digital and small changes in film thicknesses. The process is characterized by smoothness and conformality, and also directionality in the case of some ALE.

ALE can be used in advanced semiconductor manufacturing (e.g. technology node of less than about 10 nm) for the blanket removal or pattern-definition etching of ultra-thin layers of material with atomic scale in-depth resolution and control. Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example atomic layer etch and etching techniques. In various embodiments, ALE may be performed with plasma, or may be performed thermally.

ALE may be performed in cycles. The concept of an "ALE cycle" is relevant to the discussion of various embodiments herein. Generally an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as sweeping one of the reactants or byproducts. Generally, a cycle contains one instance of a unique sequence of operations. As an example, an ALE cycle may include the following operations: (i) delivery of a reactant gas, (ii) purging of the reactant gas from the chamber, (iii) delivery of a removal gas and an optional plasma, and (iv) purging of the chamber. In some embodiments, etching may be performed nonconformally. FIG. 1 shows two example schematic illustrations of an ALE cycle. Diagrams 171a-171e show a generic ALE cycle. In 171a, the substrate is provided. In 171b, the surface of the substrate is modified. In 171c, the next step is prepared. In 171d, the modified layer is being etched. In 171e, the modified layer is removed. Similarly, diagrams 172a-172e show an example of an ALE cycle for etching a silicon film. In 172a, a silicon substrate is provided, which includes many silicon atoms. In 172b, reactant gas chlorine is introduced to the substrate which modifies the surface of the substrate. The schematic in 172b shows that some chlorine is adsorbed onto the surface of the substrate as an example. Although chlorine is depicted in FIG. 1, any chlorine-containing compound or suitable reactant may be used. In 172c, the reactant gas chlorine is purged from the chamber. In 172d, a removal gas argon is introduced with a directional plasma as indicated by the $Ar^+$ plasma species and arrows, and ion bombardment is performed to remove the modified surface of the substrate. Ion bombardment in low energy ALE is performed continuously, and at process conditions that prevent the substrate from sputtering. For example, during this operation, a bias is applied to the substrate to attract ions toward it. The bias power is typically set to a power that prevents sputtering since the power is continuously delivered during this removal operation. Thus, the power applied to the bias is typically on the order of less than about 100 V. The bias power depends on the material to be etched, so for example, for germanium, the bias power may be between about 20 V and about 35V, while for silicon, the bias power may be between about 35 V and about 65 V. In these examples, germanium would sputter at bias powers greater than 35 V, and silicon would sputter at bias powers greater than 65 V. Accordingly, bias power is typically kept low to prevent sputtering, and also prevent damage to the substrate and surrounding materials. The minimum bias power in these example "bias windows" are the minimum bias power needed to provide enough energy to the substrate to remove the modified material. Thus, at bias powers less than 20 V for germanium or less than 35 V for silicon for continuously delivered bias power, the modified surface will not have enough energy to be removed from the substrate. In 172e, the chamber is purged and the byproducts are removed.

A cycle may only partially etch about 0.1 nm to about 50 nm of material, or between about 0.1 nm and about 20 nm of material, or between about 0.1 nm and about 2 nm of material, or between about 0.1 nm and about 5 nm of material, or between about 0.2 nm and about 50 nm of material, or between about 0.2 nm and about 5 nm of material. The amount of material etched in a cycle may depend on the purpose of etching in a self-limiting manner. In some embodiments, a cycle of ALE may remove less than a monolayer of material.

ALE process conditions, such as chamber pressure, substrate temperature, plasma power, frequency, and type, and bias power, depend on the material to be etched, the composition of the gases used to modify the material to be etched, the material underlying the material to be etched, and the composition of gases used to remove the modified material. However, the combination of these factors make performing ALE for etching a variety of materials challenging.

Performing ALE in a self-limiting manner without sputtering for a variety of materials is challenging and is often limited by certain process conditions as bias power is typically kept low to prevent sputtering and damage to the substrate.

As feature sizes shrink to less than 10 nm in feature width, a 1 nm critical dimension variation between features causes large fluctuation of the aspect ratio from feature to feature, and a depth loading effect is observed in etch processes conducted by traditional ALE with continuous bias (low energy ALE). During etch processes, the etch amount per cycle of ALE of material in a deeper trenches is less than the etch amount per cycle of ALE of material in a shallower trench. In some cases, the etch amount per cycle can be less at the bottoms of features than at the top near the feature opening, even within a single feature. Without being bound by a particular theory, it is believed that to satisfy the self-limiting characteristic of ALE in extreme 3D structures, the ion energy supplied from the plasma would need to be altered. However, for substrates having features of various aspect ratios, if an ion energy were selected such that it was sufficient to etch features having a large feature opening using ALE, features having narrower feature openings will receive ions having reduced energy and flux, thereby being inefficient in etching the smaller features. However, if a greater ion energy were selected to effectively etch the features having narrow feature openings, the larger features would experience much higher ion energy, which would thereby sputter the surfaces of the larger features, eliminating the self-limiting aspect of ALE. This depth loading effect manifested in 3D structures suggests that etch rate depends on the geometry of features.

There are several reasons why there may be geometric dependence during etching. One example challenge that may be present is a charging effect which occurs where due to the generation of positive ions, there is some accumulation of such positively charged ions at or near the feature openings of high aspect ratio features due to the narrow feature opening, thereby resulting in a charged differential within the depth of the feature where the feature opening is more positively charged than the bottom of the feature, which results in a repelling phenomenon between the incoming positively charged ions used to remove the modified surface and the positively charged feature opening, thereby resulting in uneven removal of the modified surface at the bottom of the feature.

Given the increasing number of new materials being introduced into integrated circuit processing and the large number of combinations of process parameters (gas pressure, wafer temperature, plasma power, ion energy, etc.), achieving an ALE process that does not sputter but also etches in a layer-by-layer self-limiting way for a given material while avoiding the charging effect in high aspect ratio features is challenging.

Provided herein are methods of performing controlled atomic layer etching using high energy. Disclosed embodiments involve exposing a surface of material to be etched to a modification gas to modify the surface and form a modified surface and exposing the modified surface to an energetic particle to remove the modified surface relative to an underlying unmodified surface, the energetic particle having an ion energy sufficient to overcome an average surface binding energy of the underlying unmodified surface.

For example, a substrate may include a material to be etched, the material having an average surface binding energy. The material to be etched includes various layers of material. Given the self-limiting aspect of atomic layer etching, during the exposure to the modification gas, the modification gas modifies the surface of the material to be etched such that the exposed surface is modified, but an underlying material is not modified. When the modified material is exposed to an energetic particle, such as an ion, electron, neutron, photon, or other species, the energetic particle removes the modified surface, leaving behind the underlying unmodified surface, and maintaining the self-limiting aspect of ALE. The energetic particle is delivered with high energy, which may be an ion energy sufficient to overcome an average surface binding energy of the underlying unmodified surface of material to be etched. That is, in some embodiments, if the energetic particle were delivered to the surface in large doses, such as many energetic particles all at once, the energetic particle would break the bonds of the underlying material, thereby sputtering the material under the modified surface and minimizing the self-limiting aspect of ALE. In contrast, disclosed embodiments involve modulating the energy of the energetic particle with the dose for delivering the energetic particle such that high energy is compensated by delivering a small dose.

In low energy ALE, low energy is compensated by delivering a high dose; that is, energetic particles are delivered with low energy but can be delivered continuously in high doses and still remove only the modified surface without affecting the underlying unmodified surface to maintain a self-limiting aspect of ALE. However, in high energy ALE, high energy is compensated by delivering a low dose; that is, an energetic particle is delivered with high energy which would be much greater than energy used in low energy ALE (and would remove more than the modified surface if delivered in the same dose as in low energy ALE) but in a low dose such that the etching is still self-limiting.

Various embodiments involve modifying a surface of material to be etched and exposing the modified surface to an attenuated dose of activated species generated from activating a removal gas to remove some, or all of the modified surface. An attenuated dose can be achieved using a variety of ways. One way to provide an attenuated dose of the activated species is to deliver the activated species in temporally separated pulses, which may involve pulsing plasma power, bias voltage, gas flows, or more, in synchronous or asynchronous manners between high/low as well as on/off processes. An attenuated dose is defined as delivering reduced effect of a dose having an energy greater than a sputter threshold energy for the material to be etched when delivered continuously to the modified surface. In some cases, the sputter threshold is the surface binding energy of the material to be etched.

Another way to deliver an attenuated dose is by varying ion flux of activated species, whereas a dose without attenuation would have an energy greater than the surface binding energy. Yet another example of delivering an attenuated dose is by varying the duration for which the modified surface is exposed to the attenuated dose of activated species. The duration can be insufficient to remove the modified surface. For example, a single pulse for a given duration of the attenuated dose may be insufficient to remove the modified surface, but two or more pulses for the same duration delivered in an attenuated dose over time may be sufficient to remove the modified surface. Another example involves delivering an attenuated dose by varying the acceleration of ions generated in the activated species to the modified surface. Another example involves delivering an attenuated dose by varying the bias voltage applied to a substrate support holding the substrate for directionally delivering the activated species to the modified surface. In some embodiments, the attenuated dose is sufficient to remove the modified surface without sputtering underlying unmodified material.

Previous techniques for performing ALE were based on obtaining a "ALE window" of bias voltage applied to a substrate support holding the substrate during the removal operation of ALE to provide sufficient energy to the modified surface to remove the modified surface molecules from the substrate (the lower limit of the ALE window) but provide less than a threshold energy of the modified surface which, if exceeded, would result in physical sputtering of the material and/or the surface underlying the modified surface (the upper limit of the ALE window). Such techniques focused on providing low bias voltage and low plasma powers to prevent sputtering of the material on the surface to ensure removal by ALE was self-limiting and can therefore be controlled in a layer-by-layer process.

In contrast, disclosed embodiments involve operating high plasma powers, high bias voltages, or both. It will be understood that the terms "bias power" and "bias voltage" are used interchangeably herein to describe the voltage for which a substrate support is set when a bias is applied to the substrate support. A threshold bias power or threshold bias voltage refers to the maximum voltage of the bias applied to a substrate support before material on the surface of a substrate on the substrate support is sputtered. The threshold bias power therefore depends in part on the material to be etched, the gas used to generate plasma, plasma power for igniting the plasma, and plasma frequency. Bias power or bias voltage as described herein is measured in volts, which are indicated by the unit "V" or "Vb", where b refers to bias. Electron volts (eV) as described herein is the amount of energy one electron acquires by accelerating through a potential difference of 1 Volt. Electron volts refer to the amount of energy one electron acquires by accelerating through a potential difference of 1 Volt. Disclosed embodiments can operate at low duty cycle pulses, such as duty cycles between 1% and 10%. Disclosed embodiments overcome the charging concern because the high energy delivered to the activated removal gas is sufficient to overcome the repelling effect. Although in low energy ALE one could envision trying to use a higher bias power to overcome the repelling effect, higher bias power in low energy ALE will result in sputtering or damage to the substrate due to long exposure time, thereby losing the self-limiting feature of ALE. In contrast, using pulsed ALE at high energy overcomes the repelling effect while maintaining the self-limiting characteristic of ALE without sputtering.

Figure 13:
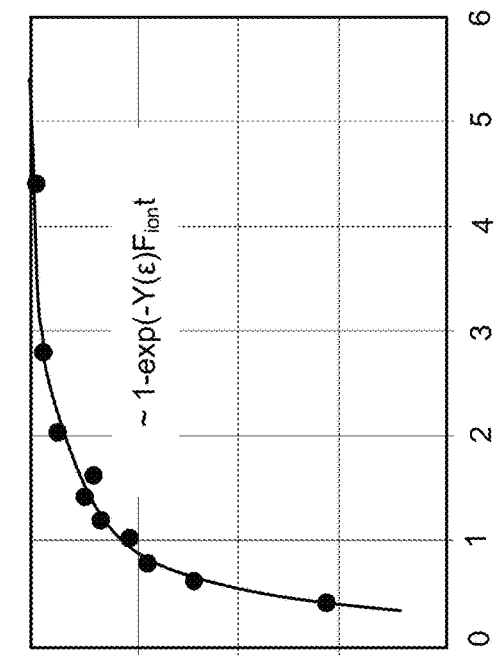
FIG. 13 is an example of ion energy as a function of "on" time for argon exposure for complete removal.

As shown in FIG. 13 which is further described below, it is typically expected that with a short duty cycle, removal of the modified layer is incomplete.

However, disclosed embodiments involve using short duty cycles as one technique for performing ALE using high energy. Without being bound by a particular theory, it is believed that there is a time dependence related to the removal operation of ALE.

Let this example involve a silicon surface modified by chlorine plasma and the modified surface having SiCl which can be removed using argon plasma. It will be understood that this is provided as only one example, but that the below representations are relevant to any suitable material for etching by any suitable plasma (in lieu of chlorine) and energetic species (in lieu of argon plasma) for ALE generally, including both low energy and high energy ALE.

Let $N_0$ represent the total number of surface sites on a substrate. The total number of surface sites is given by:

$$N_0 = N + S \qquad \text{Eqn. 1}$$

where and N represents the total number of unreacted sites (sites for which SiCl remains on the surface), and S represents the total number of reacted sites (sites where there is only the underlayer of Si remaining).

The reaction for desorbing chlorine onto the substrate is given by $$\text{Si-Si}_{Cl}(s) + \text{Ar+ions} \rightarrow \text{Si}(s) + \text{SiCl}(g) \qquad \text{Eqn. 2}$$

This equation depicts ion-assisted desorption, and assumes no reverse reaction with rate efficiency Y=yield, in reactions per ion.

Let F be the flux of ions given in ions/cm²–sec.
The rate of expression is therefore given by $$\text{rate}_{rxn} = \frac{d}{dt}[S] = Y \cdot F \cdot [N] = Y \cdot F \cdot ([N_0] - [S]) \qquad \text{Eqn. 3}$$

The derivation of [S] is given by the following expression at time t, assuming k is dependent of [S] and t:

$$\int_0^{[S]_t} \frac{d[S]}{[N_0] - [S]} = \int_0^t YF dt \qquad \text{Eqn. 4}$$

$$[S]_t = [N_0](1 - e^{-YFt})$$

The fractional surface reacted is given by θ as follows:

$$\theta(t) \equiv \frac{[S]_t}{[N_0]} = (1 - e^{-YFt}) \qquad \text{Eqn. 5A}$$

$$\theta(t) = 1 - \exp\left(\frac{-Y \cdot F \cdot t}{d}\right) \qquad \text{Eqn. 5B}$$

Eqn. 5A is rewritten as Eqn. 5B. In Eqn. 5B, θ(t) represents the removal amount as a function of time, where Y(ε) is the ion yield for removing a product (0.1 ion at 0 eV, whereby Y(ε)~√ε_t–√ε_{th}), d is the surface density in units of 1/cm2, F is the ion flux, which in some apparatuses may be ~1E16/cm² s at 50 eV, and t is the "on" time of argon ions, such as a 0.2 second dose for 10% duty cycle of a 2 second operation.

Figure 12A:
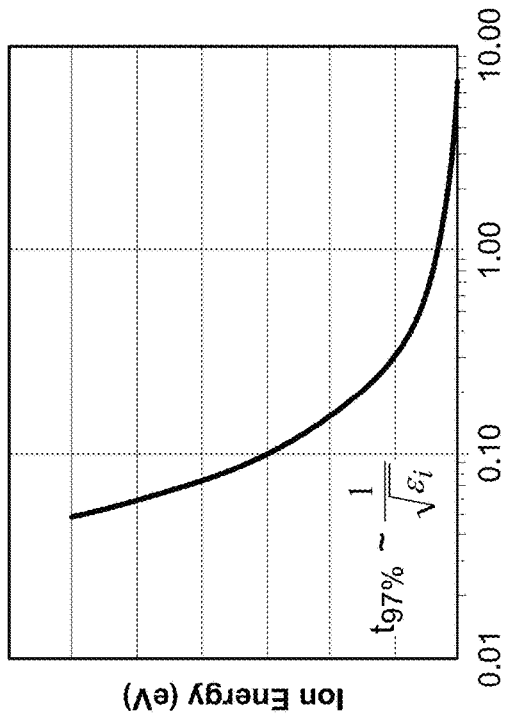
FIG. 12A is graph of an example etch per cycle model based on a function provided in Eqn. 5B.
Figure 12B:
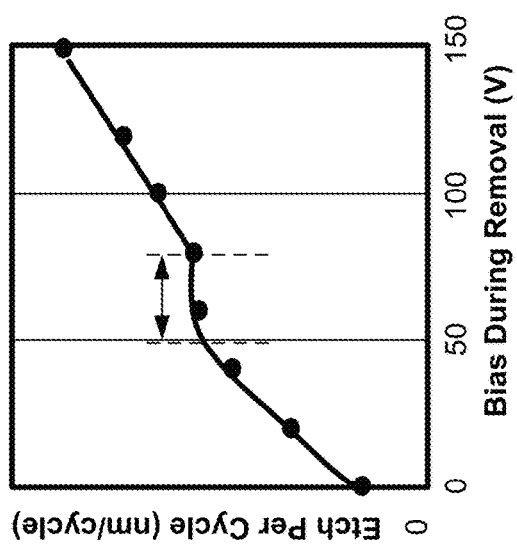
FIG. 12B is a graph of etch per cycle as a function of argon bias in an example of low energy ALE.

FIG. 12B, which is later described below, shows an example of etch per cycle using this inverse relationship function of Eqn 5A for ALE of silicon. Without being bound by a particular theory, it is believed that fewer ions are needed at higher energy due to momentum transfer being more efficient at higher energy. An example is provided in the FIGS. 4I and 4J. In FIG. 4I, low ion energy of 50 eV delivered to a modified surface removes the modified surface using argon delivered at a velocity of 13000 m/s, where Y~0.1 SiClx/ion. In comparison, in FIG. 4J, high ion energy of 300 eV delivered to a modified surface removes the surface using argon delivered at a velocity of 33000 m/s, where Y~0.5 SiClx/ion. Thus, for a surface that needed 10 ions to remove using low ion energy, only two ions are needed to remove the same surface using high ion energy.

Without being bound by a particular theory, while sputtering increases with ion energy, the SiCl surface etches faster than the underlying Si surface, and thus the contribution to the etch amount is small until the reactive layer is removed. If the exposure time is very short, then the reactive layer is present for the majority of the removal time. For example, FIG. 15 shows an example of etch rate versus argon bias whereby SiCl etches faster (1501) than Si (1502) at all energies.

FIG. 16A shows an example of low energy ALE with 50V bias at 1.5 seconds/cycle, which results in smoother surfaces, larger exposure time window, and more resolution per cycle, which can result in less damage to the underlayer. The grey represents TEOS on the substrate. The green presents the underlying material. FIG. 16B shows an example of the same substrate structure exposed to pulsed ALE using high energy, which results in higher throughput using similar synergistic effects, improved aspect ratio dependent etching (ARDE) due to narrower ion angular distribution function (IADF) given by 8° at 50 eV as opposed to 2° at 500 eV, less charging effect, and less re-deposition and ion scattering. High energy ALE can be delivered in short pulses which may be useful for use in CCP reactors. High energy ALE allows for a larger ion energy window.

Disclosed embodiments are suitable etching a variety of materials, including metals, metal-containing materials, dielectric materials, semiconductor materials, insulating materials, and more. Non-limiting examples include silicon, silicon oxide, silicon nitride, tungsten, carbon, germanium, metal oxides, and metal nitrides (such as titanium nitride, aluminum nitride, etc.). While examples provided herein are directed to etching silicon, it will be understood that disclosed embodiments can be used to etch a variety of materials, and modification gas chemistry, removal gas chemistry, and process conditions may depend on the material to be etched.

Methods and apparatuses herein are directed to performing high energy atomic layer etching. High energy atomic layer etching (high energy ALE) can be used by compensating high energy with low dose. In contrast, conventional ALE performed at lower energy (low energy ALE) involves low energy with high dose. Dose is defined as the number of ions used during the removal operation of ALE.

In some embodiments, high energy ALE can be performed using an etch process referred to herein as pulsed atomic layer etching. In some cases, the terms "high energy ALE" and "pulsed ALE" are used interchangeably. A single high energy ALE cycle includes at least two operations: 1) surface modification in continuous or pulsing plasma; and 2) removal of the modified surface using one or more pulsed energy sources, such as bias power, or radio frequency plasma power, or both, or photon energy, to remove the modified layer. Multiple pulses may be used in any of the surface modification and/or removal operations in a single high energy ALE cycle. For example, in some embodiments, 100 or more pulses of bias power pulsing may be performed during removal. During the removal, either the bias or the power or both may be pulsed, and in some cases, other energy may be used, such as photonic energy. Pulses may be synchronous or asynchronous when using both bias and plasma power pulsing. Frequencies for the pulsing may be the same or different. Pulsing conditions, including pulsing on/off or between low and high powers or voltages, frequency of pulses, duty cycle of pulses, and duration of pulses, may be carefully tailored depending on the modification chemistry, removal gas chemistry, material to be etched, substrate feature profile, and application of the disclosed embodiments.

Disclosed embodiments can be performed in a high energy ALE regime using between about 10 times and about 20 times higher ion energy than low energy ALE processes. Some embodiments are performed by synchronized pulsing of power of an inductively coupled plasma and bias to the substrate applied by delivering a voltage to the substrate at very low duty cycles being between about 1% and about 10%. The new process regime allows one to etch extremely narrow features with high aspect ratios, such as greater than about 30:1, with low loading effect and reduced or eliminated lateral etch.

Pulsed ALE may involve both pulsing plasma and ions bias pulsing such that pulsing is performed both during modification and removal.

Pulsing during surface modification can control effective plasma time and be tailored to the apparatus or tool used to perform the modification. Pulsing during removal can be used to remove the modified surface using high energy. In some embodiments, pulsing during removal may include both pulsing RF plasma and pulsing bias power, and pulsing may be synchronized such that RF plasma power pulsing and bias power pulsing are pulsed at the same pulsing frequency and using the same duty cycle.

Pulsed ALE using pulsed energy provides a way to extend the self-limiting synergy window. Synergy means that favorable etching occurs due to interaction of both the surface modification and the removal operations. The extended synergy window to a higher bias/energy regime can compensate the ion energy/flux loss reaching the etch front due to ion scattering associated with extremely narrow 3D structures. Thus, high energy ALE provides an operating regime allowing the same etch per cycle in self-limiting reactions for a wide spectrum of critical dimensions and aspect ratios.

High energy ALE extends the self-limiting energy window for the synergy behavior of atomic layer etching. In continuous ion bombardment, the sputter threshold voltages of silicon for example may be greater than 100V. That is, at bias powers greater than 100V, the silicon surface will sputter. Pulsing mode generates plasma and ions at a given frequency and duty cycle. With power/bias pulsing at lower duty cycle, the threshold sputter bias can be increased to a higher bias power. Thus, bias pulsing increases range and the magnitude of the self-limiting energy window by at least one order of magnitude compared to low energy ALE.

Without being bound by a particular theory, it is believed that pulsed atomic layer etching is achieved due to the reduced ion fluence with pulsing. Given that fluence equals flux times time, it represents the dose of ions. As the simplest estimate, the reduction in dose can be calculated by the duty cycle and the ratio of step times. For example, for a 10% duty cycle, whereby the dose time is 2 seconds instead of 5 seconds with the pulsing, then the effective reduction in fluence is 94%. Thus, in this example, the wafer is exposed to 0.06 times the original ion dose used in low energy ALE. The etched amount per cycle depends on ion dose and ion energy. In general, reducing the dose will result in lower etch amount. Without being bound a particular theory, it is believed that the lower dose can be compensated by going to higher ion energy Compared with reactive ion etching, high energy ALE employs two self-limiting steps to control the transport of reactants, and surface reaction independently. The pulsing bias mode redefines the self-limiting window for ALE to provide a regime for etching 3D structures by ALE where bias power or RF power is independent of trench size and aspect ratio. Provided embodiments are suitable for etching both on blanket and patterned substrates. In some embodiments, the bias window for high energy ALE may have non-sharp maximum values, such that the maximum bias voltage used for high energy ALE without causing sputtering is a range of values, rather than a single set value.

Disclosed embodiments expand the ALE energy window, which is referred to as a range of voltage whereby etching is substantially self-limiting. In some embodiments, the ALE energy window is determined by evaluating etch per cycle versus voltage graph and in some embodiments involves identifying where etch per cycle is a plateau and the energy window is calculated as ±about 10% of the plateau value. In some embodiments, this can be performed by determining the inflection points at which a positive slope becomes a slope of 0 (a minimum), and a slope of 0 becomes a positive slope (a maximum). In some embodiments, the ALE energy window is a range of voltage that can be applied to the substrate to remove the modified surface of material without sputtering the substrate. The range of voltage includes a minimum voltage, which is the minimum voltage needed to provide enough energy on the modified surface to remove the modified material and a maximum voltage, which is the maximum voltage the substrate can withstand before the removal gas sputters the substrate.

In low energy ALE, bias windows are typically narrower in the range of bias voltages tend to be lower to prevent damage to the substrate caused by sputtering. By altering the duty cycle and therefore changing the duration of the applied energy to the removal gas, as the duty cycle decreases and thus as the duration of exposure to the energy decreases, the bias windows increase in range and in amplitude such that the bias voltages that can be applied to the substrate can be up to 10 to 20 times greater than the bias voltages used during low energy ALE. It may generally be expected that using greater energy on the removal gas during removal would result in more damage, and thus one would try to mitigate damage by reducing the amount of energy by reducing bias voltage or RF plasma power. However, without being bound by a particular theory, it is believed that the amount of energy expended over time for each set of modification chemistry, removal gas chemistry, and substrate material chemistry is used to provide a bias window for removing modified material. In low energy ALE, a certain limitation on bias power is observed to prevent sputtering. However, in high energy ALE, the bias power can be up to 10 or up to 20 times greater than the bias power used in low energy ALE since the bias is delivered over time in pulses. Note that while high energy ALE is performed in pulses, in some embodiments other techniques may be used to deliver high energy during ALE. While low energy ALE at bias powers that are used for high energy ALE would result in sputtering, high energy ALE separates out the high bias power over time, thereby preventing any sputtering on the substrate. The combination of energy applied and time (e.g., duty cycle) and flux, as dependent on the modification chemistry, removal gas chemistry, and material to be etched, can be modified to maximize the bias window using certain disclosed embodiments.

Figure 2:
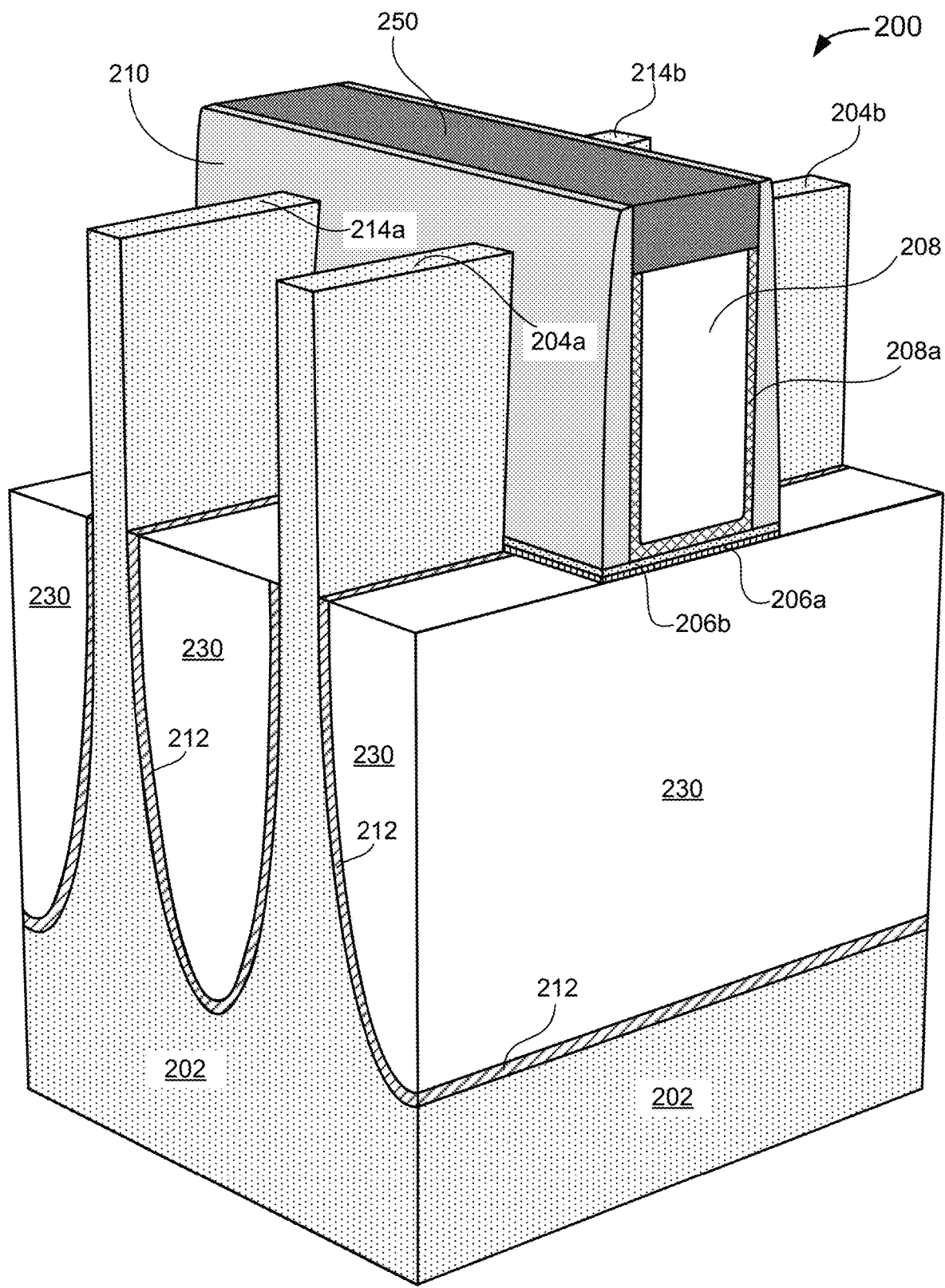
FIG. 2 shows a three-dimensional schematic view of a FinFET semiconductor device.

Disclosed embodiments may be particularly suitable for etching features for FinFET applications. FIG. 2 shows an example FinFET structure (fin-shaped field effect transistor) 200. Substrate 202 may be a semiconductor substrate. In this structure, surfaces 214a and 204a correspond to source regions, while 214b and 204b correspond to drain regions. Liner 212 separates the semiconductor material of substrate 202 from the insulator material 230 such as silicon oxide. Thin gate dielectric layers 206b and 206a may be deposited over the insulator material 230 and may separate the insulator material 230 from the gate, which includes spacers 210, gate electrode 208, and gate electrode barrier 208a. Electrical contact 250 is formed over the top of the gate. Certain disclosed embodiments can be used to define the fin/shallow trench isolation with minimum depth loading for trenches formed in substrate 202. Additionally, certain disclosed embodiments may be suitable for dummy gate removal for gate electrode deposition.

Figure 3A:
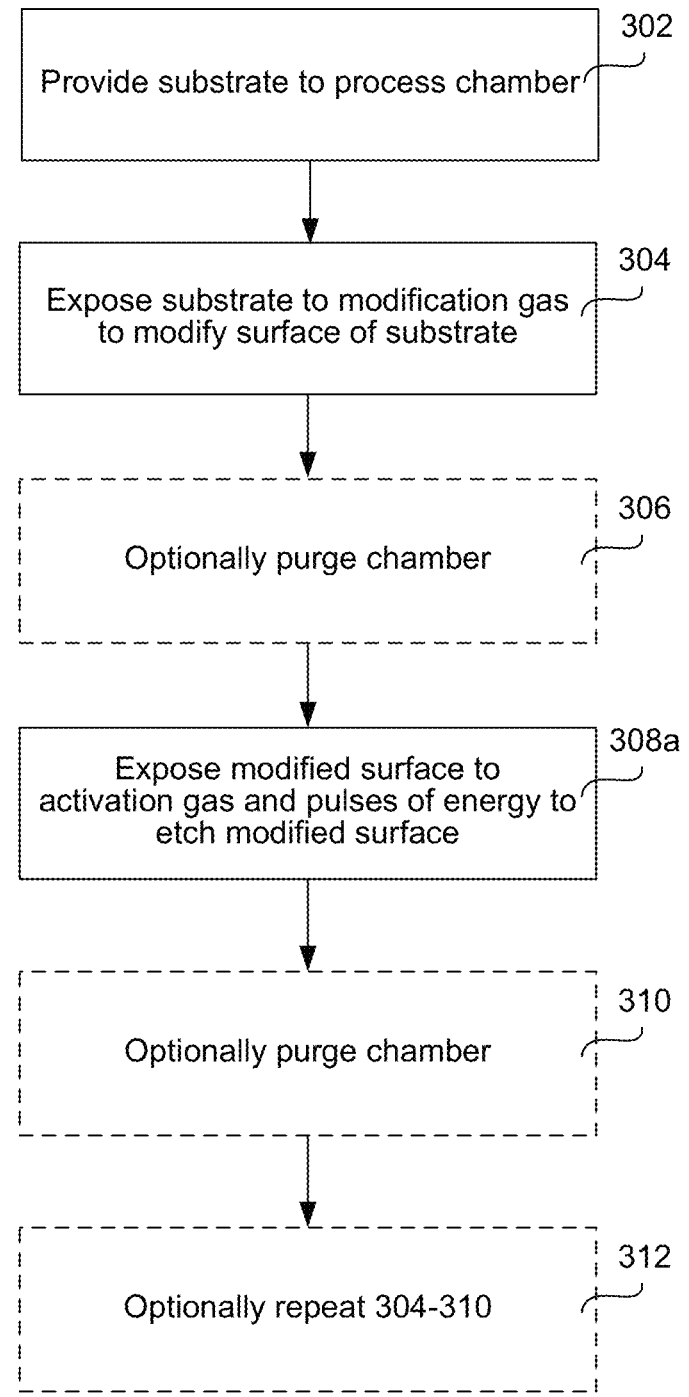
FIGS. 3A and 3B are process flow diagrams depicting operations for methods in accordance with certain disclosed embodiments.
Figure 3B:
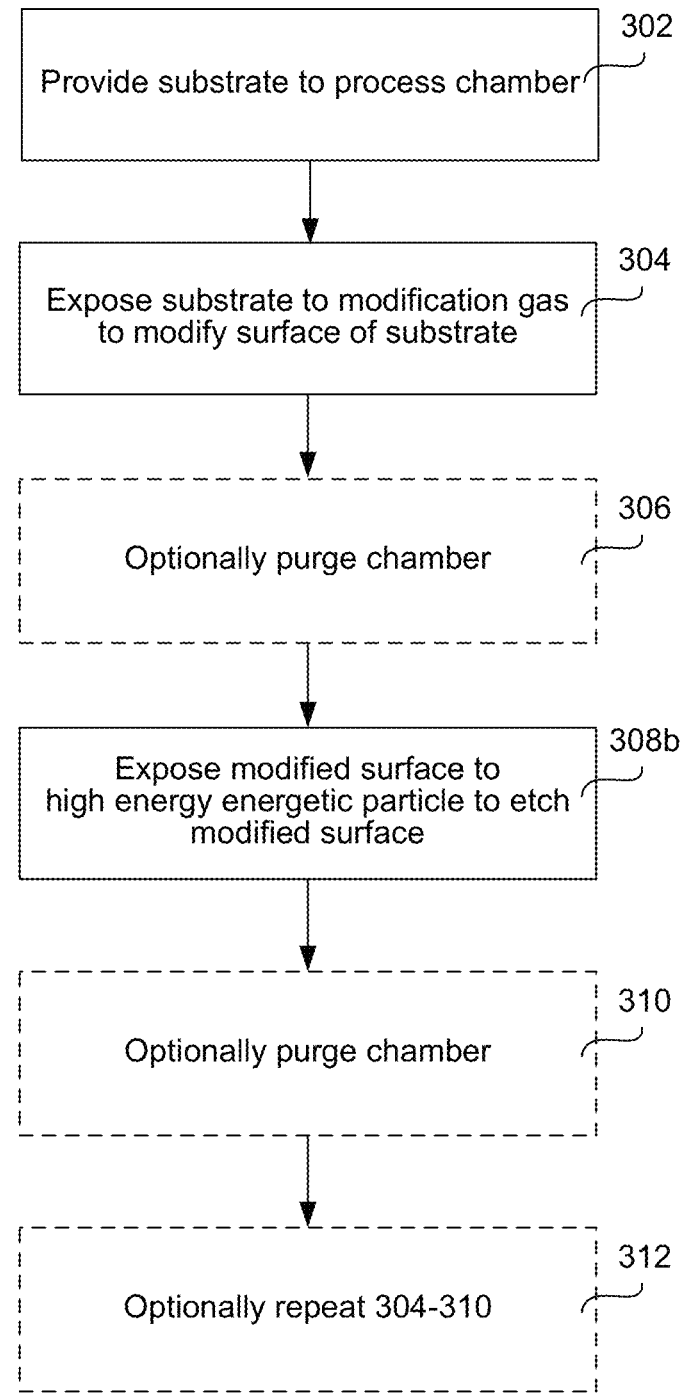

FIGS. 3A and 3B are process flow diagrams depicting operations in methods that are performed in accordance with certain disclosed embodiments. Operations in FIGS. 3A and 3B may be performed at a chamber pressure between about 1 mTorr and about 100 Torr, e.g., about 1 mTorr and about 1 Torr, such as about 50 mTorr. Operations in FIGS. 3A and 3B may be performed at a substrate temperature between about 0° C. and about 120° C.

For the following discussion it will be understood that operations 302, 304, 306, 310, and 312 of FIG. 3A may correspond to and/or be the same as operations 302, 304, 306, 310, and 312 of FIG. 3B. In operation 302, a substrate is provided to a process chamber. The substrate may be a silicon wafer, e.g., a 200-mm wafer, a 300-mm wafer, or a 450-mm wafer, including wafers having one or more layers of material such as dielectric, conducting, or semi-conducting material deposited thereon. A patterned substrate may have "features" such as vias or contact holes, which may be characterized by one or more of narrow and/or re-entrant openings, constrictions within the features, and high aspect ratios. The features may be formed in one or more of the above described layers. One example of a feature is a hole or via in a semiconductor substrate or a layer on the substrate. Another example is a trench in a substrate or layer. In various embodiments, the feature may have an under-layer, such as a barrier layer or adhesion layer. Non-limiting examples of under-layers include dielectric layers and conducting layers, e.g., silicon oxides, silicon nitrides, silicon carbides, metal oxides, metal nitrides, metal carbides, and metal layers.

In some embodiments, the substrate does not have any features and the surface of the substrate is a blanket layer of material. In some embodiments, the substrate includes features of various sizes. In various embodiments, types of substrates fabricated from performing disclosed embodiments may depend on the aspect ratios of features on the substrate prior to performing disclosed embodiments. In some embodiments, features on a substrate provided in operation 301 may have an aspect ratio of at least about 2:1, at least about 3:1, at least about 4:1, at least about 6:1, at least about 10:1, at least about 30:1, or higher. The feature may also have a dimension near the opening, e.g., an opening diameter or line width of between about 5 nm to 500 nm, for example between about 25 nm and about 300 nm. Disclosed methods may be performed on substrates with features having an opening less than about 20 nm.

A via, trench or other recessed feature may be referred to as an unfilled feature or a feature. According to various embodiments, the feature profile may narrow gradually and/or include an overhang at the feature opening. A re-entrant profile is one that narrows from the bottom, closed end, or interior of the feature to the feature opening. A re-entrant profile may be generated by asymmetric etching kinetics during patterning and/or the overhang due to non-conformal film step coverage in the previous film deposition, such as deposition of a diffusion barrier. In various examples, the feature may have a width smaller in the opening at the top of the feature than the width of the middle and/or bottom of the feature.

In operation 304, the substrate is exposed to a modification gas for a duration sufficient to modify at least a surface of the substrate. Etching chemistry is introduced into the chamber in operation 304. As described herein, in operations where materials are introduced into the chamber, in some embodiments involving atomic layer etch using a plasma, the reactor or chamber may be stabilized by introducing the chemistry into the chamber prior to processing the substrate or wafer. Stabilizing the chamber may use the same flow rates, pressure, temperatures, and other conditions as the chemistry to be used in the operation following the stabilization. In some embodiments, stabilizing the chamber may involve different parameters. In some embodiments, a carrier gas, such as $N_2$, Ar, Ne, He, and combinations thereof, is continuously flowed during operation 304. In some embodiments, a carrier gas is only used during removal. The carrier gas may be used as a purge gas in some operations as described below.

The modification operation forms a thin, reactive surface layer with a thickness that is more easily removed than the un-modified material in the subsequent removal operation. In a modification operation, a substrate may be chlorinated by introducing chlorine into the chamber. Chlorine is used as an example etchant species in disclosed embodiments, but it will be understood that in some embodiments, a different etching gas is introduced into the chamber. The etching gas may be selected depending on the type and chemistry of the substrate to be etched. In some embodiments, a plasma may be ignited and chlorine reacts with the substrate for the etching process. In some embodiments, chlorine may react with the substrate or may be adsorbed onto the surface of the substrate. In various embodiments, chlorine is introduced into the chamber in a gaseous form and may be optionally accompanied by a carrier gas which may be any of those described above. The species generated from a chlorine plasma can be generated directly by forming a plasma in the process chamber housing the substrate or they can be generated remotely in a process chamber that does not house the substrate, and can be supplied into the process chamber housing the substrate. In some embodiments, a plasma is not used and chlorine may be introduced thermally into the chamber.

In various embodiments, the plasma may be an inductively coupled plasma or a capacitively coupled plasma. An inductively coupled plasma may be set at a plasma between about 50 W and about 2000 W. In some embodiments, a bias may be applied between about 0V and about 500V.

In various embodiments, a plasma is ignited to facilitate the modification of the substrate surface. In some embodiments, the modification gas is ignited in a remote plasma chamber to generate a plasma species which is then delivered to the process chamber where the substrate is housed. In some embodiments, the modification gas is ignited within the process chamber.

In various embodiments, the plasma may be pulsed during operation 304. The plasma may be pulsed between an ON state at a plasma power between about 50 W and about 2000 W and an OFF state at a plasma power of 0 W. In some embodiments, the plasma may be pulsed between a low state at a plasma power between about 10 W and about 100 W and a high state at a plasma power between about 900 W and about 1500 W.

Pulsing may be performed at a pulsing frequency between about 10 Hz and about 200 Hz. The duty cycle of the plasma pulsing for the modification gas may be between about 1% and about 20%. It will be understood that pulsing may involve repetitions of periods, each of which may last a duration T. The duration T includes the duration for pulse ON time (the duration for which the plasma is in an ON state) and the duration for OFF time (the duration from which the plasma is in an OFF state) during a given period. The pulse frequency will be understood as 1/T. For example, for a pulsing period T=100 μs, frequency is 1/T=1/100 μs, or 10 kHz. The duty cycle or duty ratio is the fraction or percentage in a period T during which the energy source is in the ON state such that duty cycle or duty ratio is pulse ON time divided by T. For example, for a pulsing period T=100 μs, if a pulse ON time is 70 μs (such that the duration for which the energy source is in an ON state in a period is 70 μs) and a pulse OFF time is 30 μs (such that the duration for which the energy source is in an OFF state in a period is 30 μs), the duty cycle is 70%.

Figure 4A:
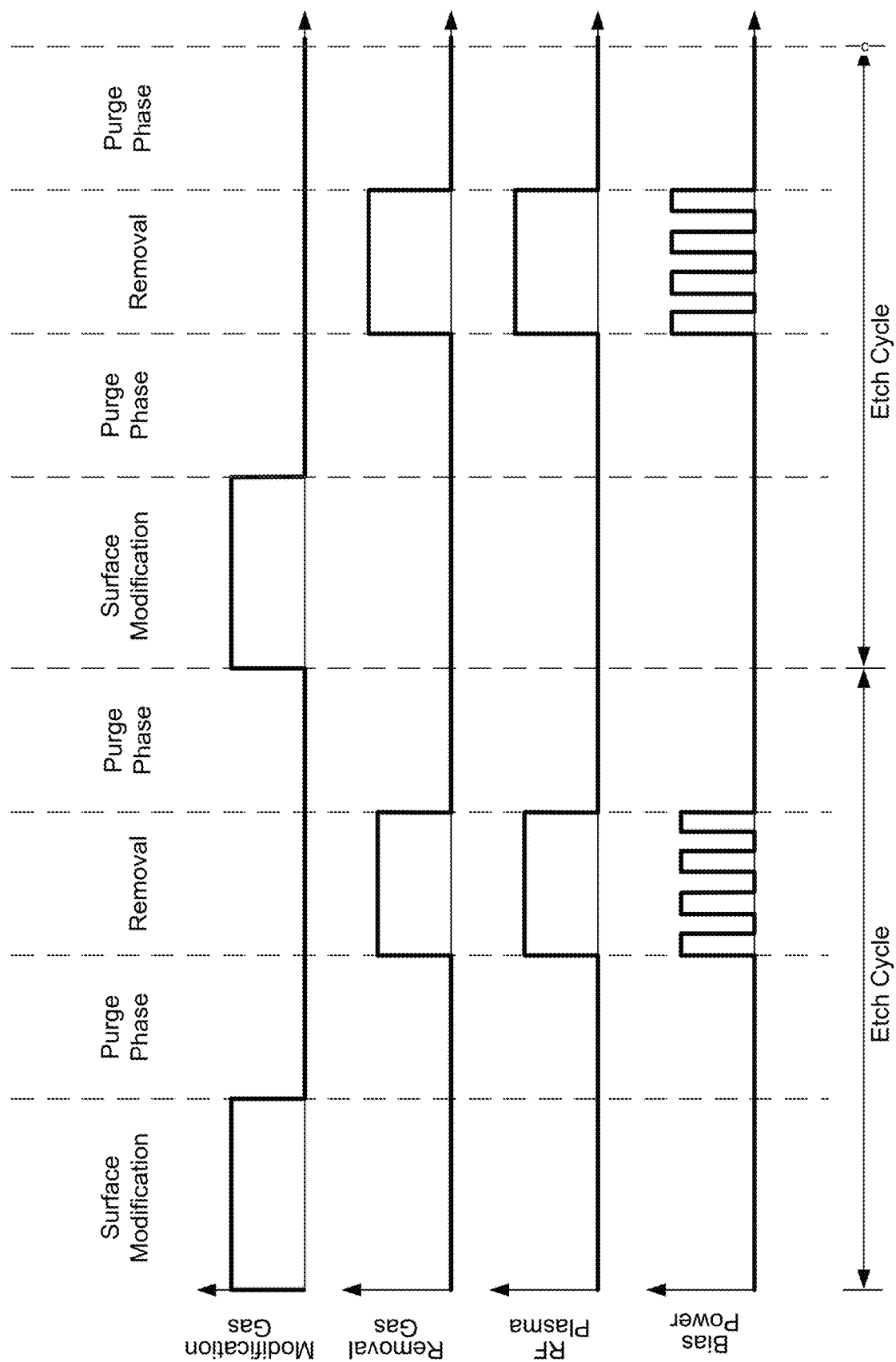
FIGS. 4A-4G are timing schematic diagrams depicting examples of operations performed in accordance with certain disclosed embodiments.
Figure 4B:
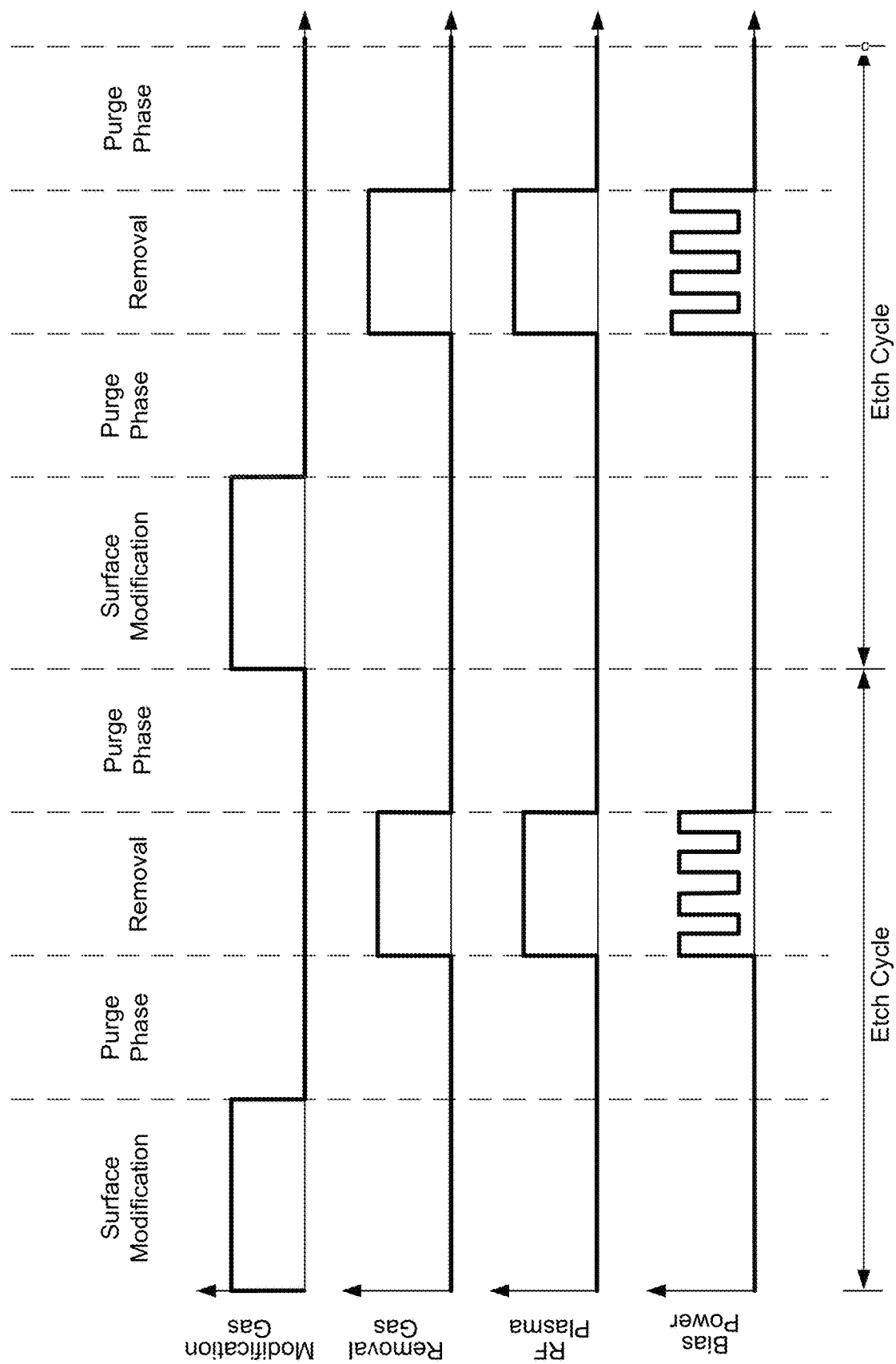
Figure 4C:
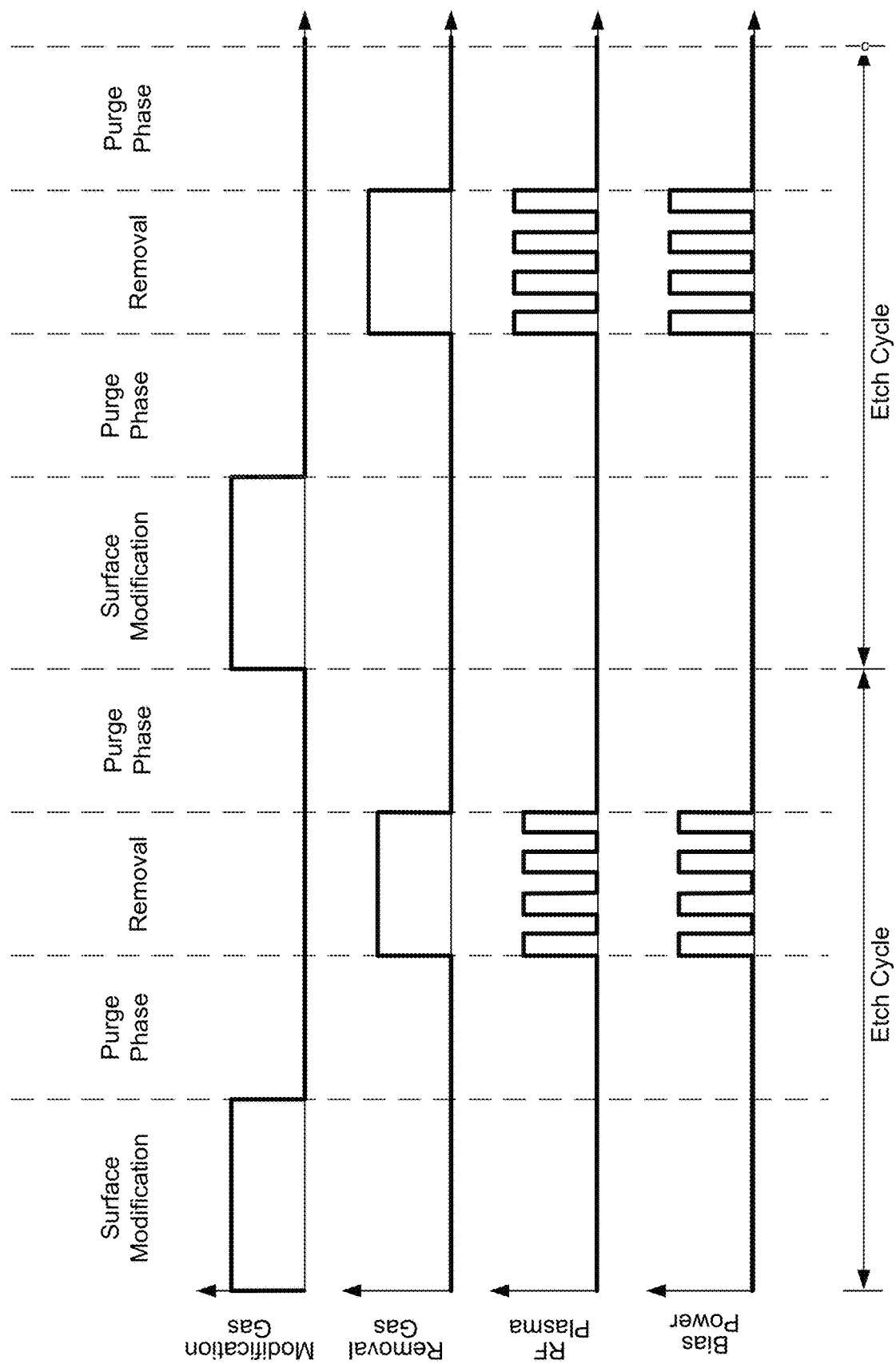
Figure 4D:
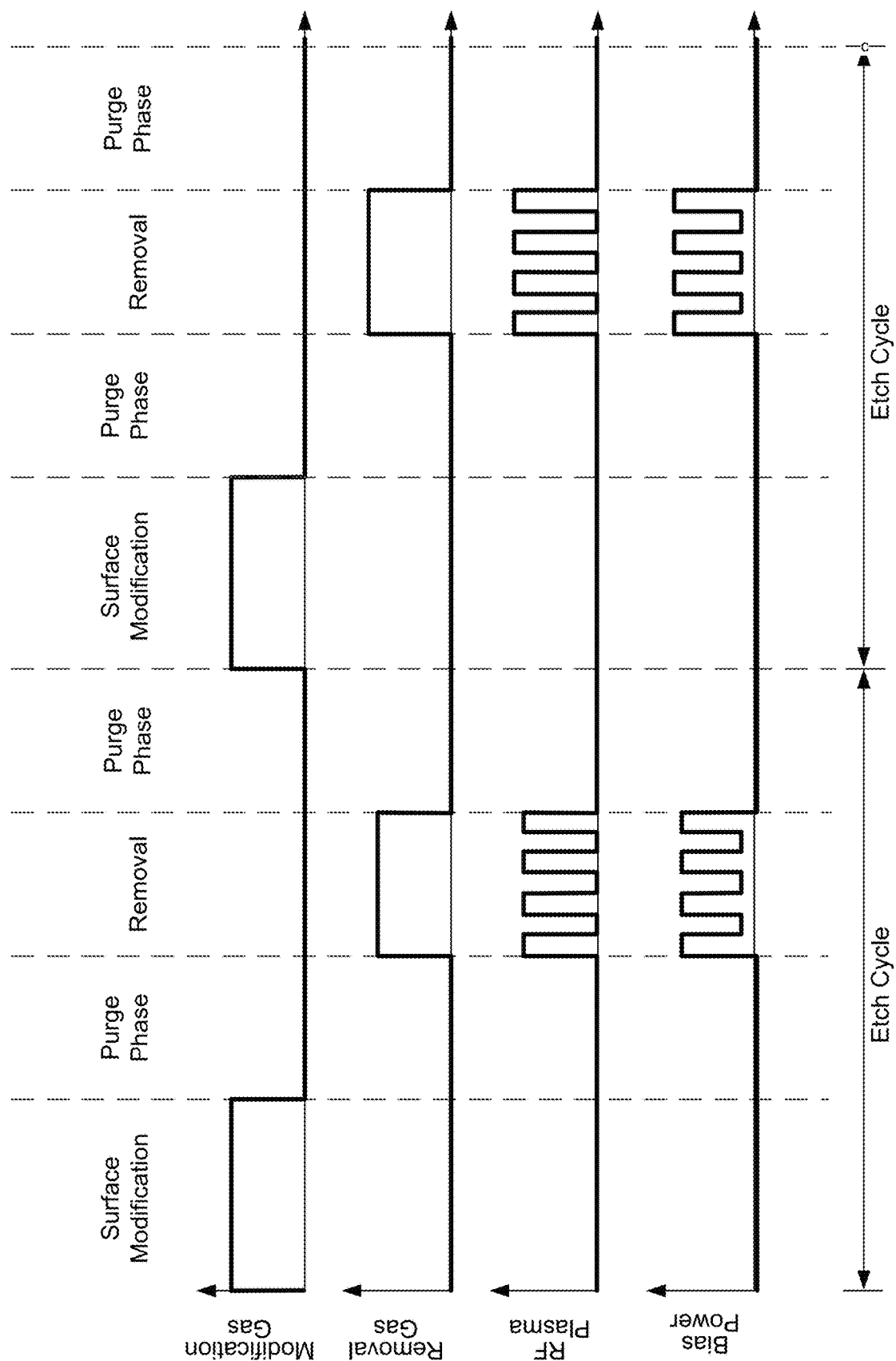
Figure 4E:
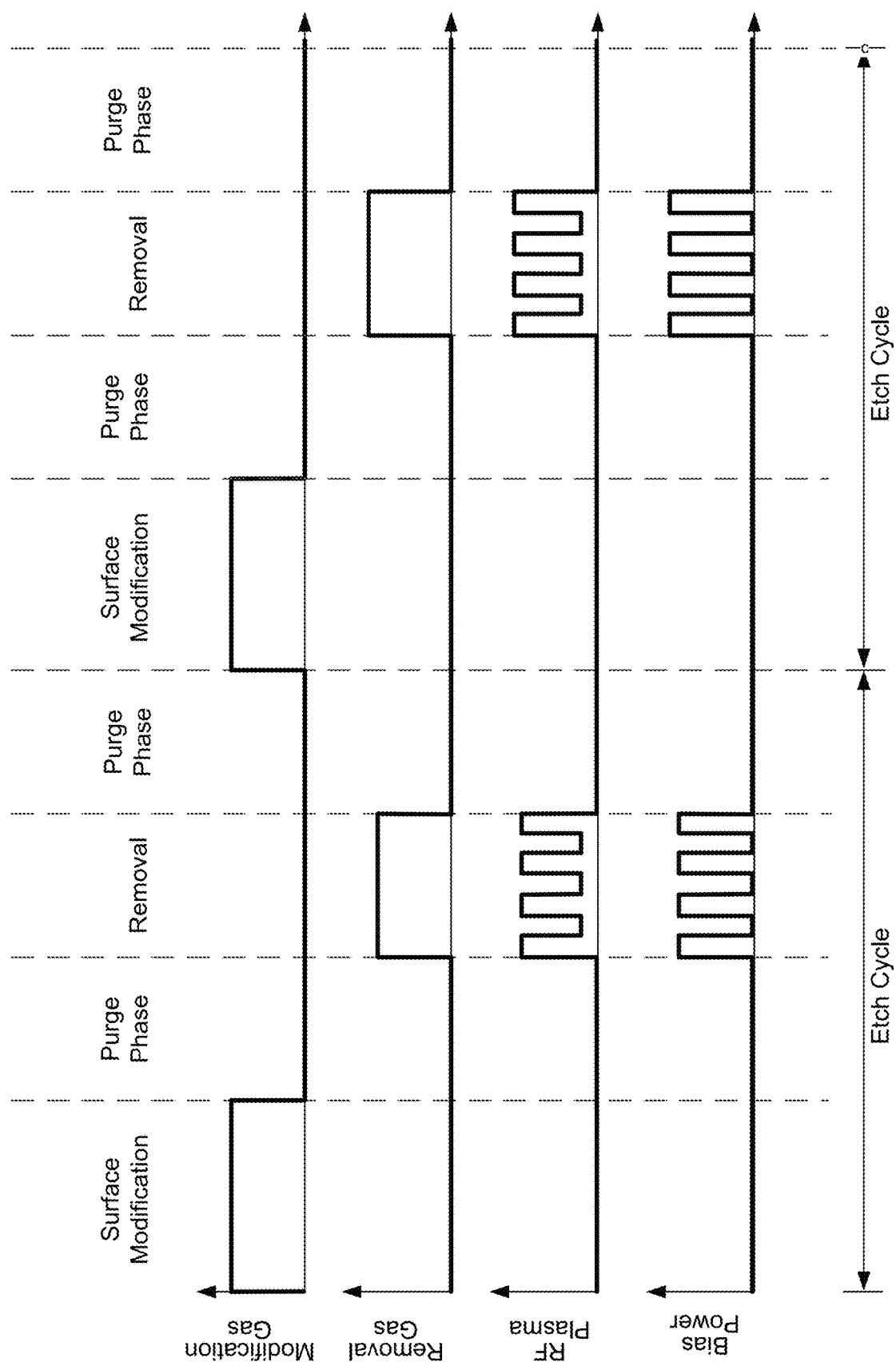
Figure 4F:
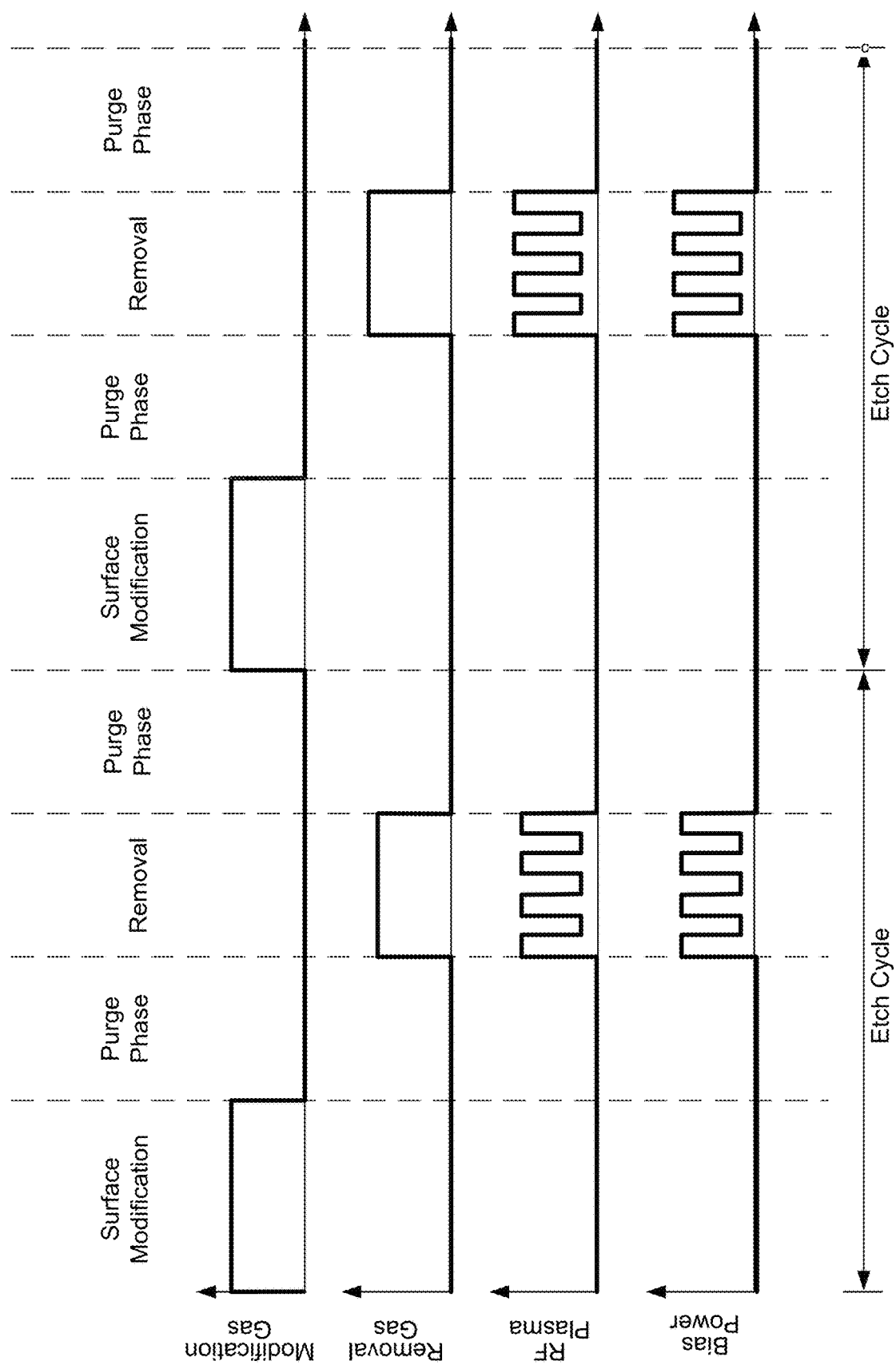
Figure 4G:
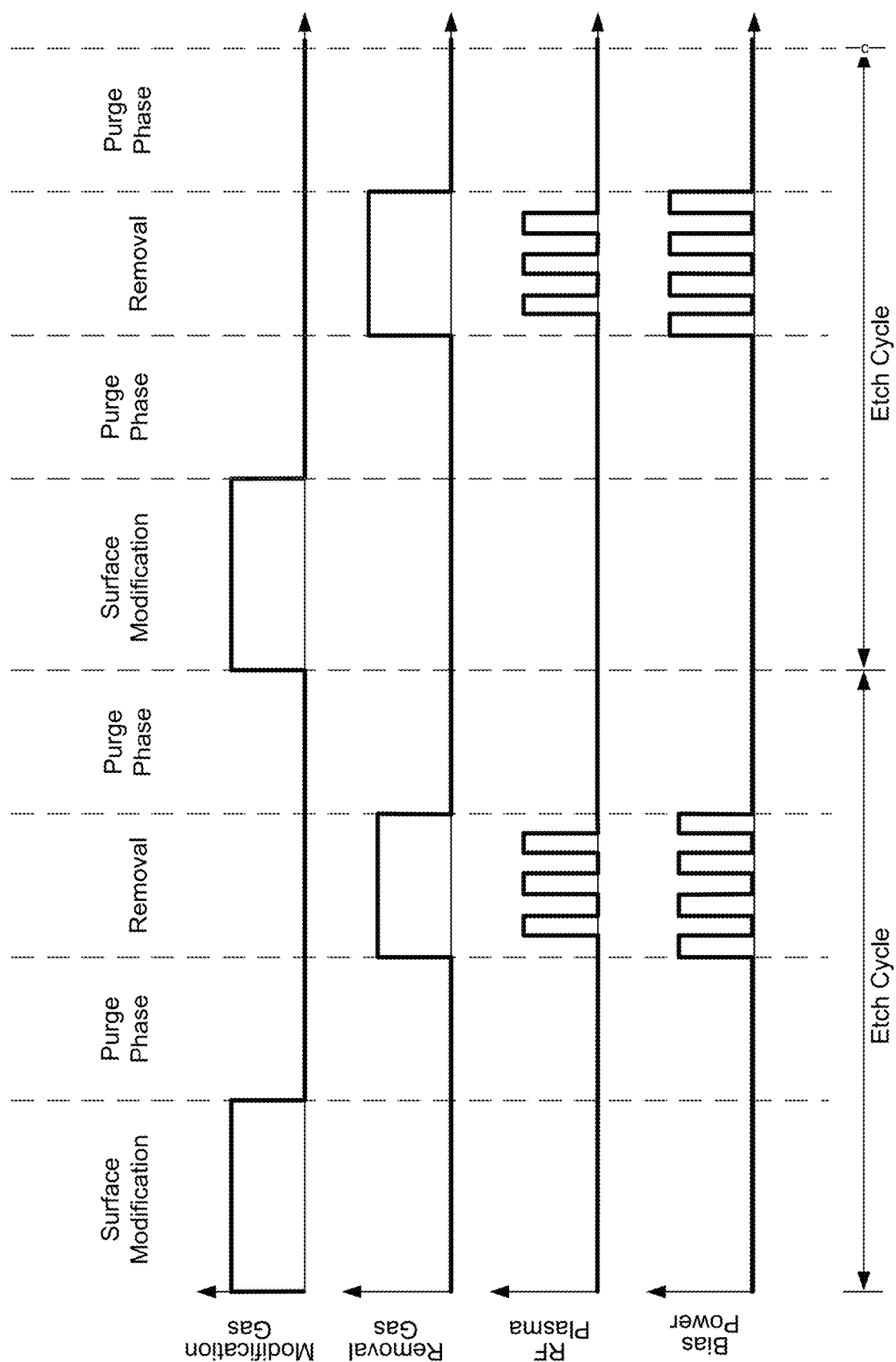
Figure 4I:
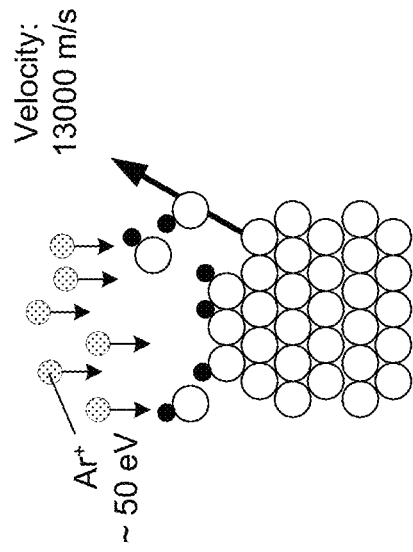
FIGS. 4I and 4J are example schematic diagrams of low and high ion energy removal of a modified layer in ALE.
Figure 4J:
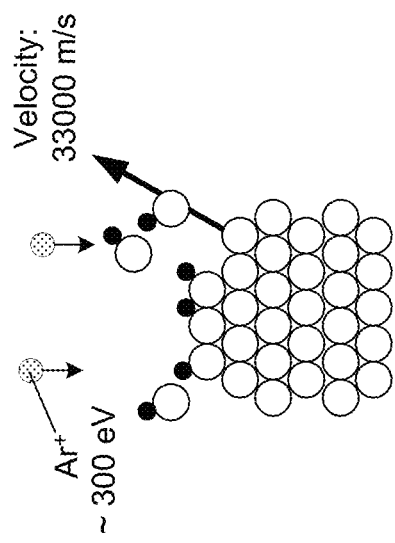
Figure 4H:
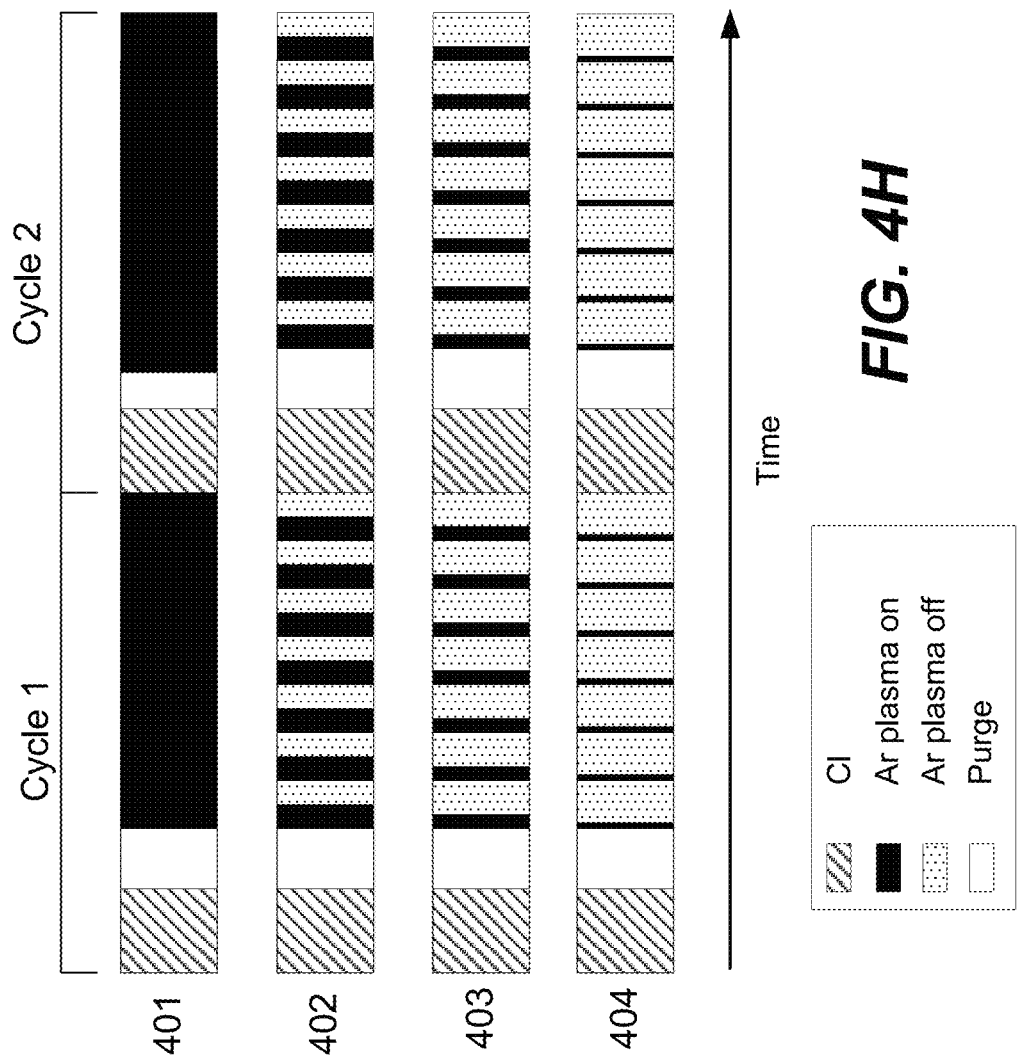
FIG. 4H is a timing schematic diagram of example low energy and high energy ALE techniques.

FIG. 4H provides examples of various duty cycles that may be used for ALE cycles, including 3%, 10%, 40%, and 100% (100% being ALE performed with sufficient synergy but at low continuous energy). The corresponding "ON" times for when Ar is turned on is provided in the schematic in FIG. 4H.

In some embodiments, plasma is pulsed to allow higher energy to be delivered to the modification gas. In some embodiments, plasma may be pulsed to allow the apparatus used to generate the plasma to operate at certain conditions addressing the limitations of the apparatus. For example, for apparatuses that are unable to deliver plasma power for a short, continuous duration, separating a dose which would be delivered in a short, continuous duration into multiple pulses over a longer period of time such that the plasma ON time overall is the same as the short, continuous duration eases delivery of the plasma power sufficient to modify most or all of the active sites on a substrate surface. For example, if the minimum amount of time needed for chlorine to modify a silicon surface continuously is 400 milliseconds, but the apparatus is incapable of delivering the chlorine gas and plasma power for that short of a continuous duration, the 400 millisecond duration can be delivered over 2 seconds using continuous chlorine gas flow and four cycles of 100 ms pulse of plasma power and 400 ms of no plasma power.

In operation 306, the process chamber is optionally purged to remove excess modification gas molecules that did not modify the substrate surface. In a purge operation, non-surface-bound active chlorine species may be removed from the process chamber. This can be done by purging and/or evacuating the process chamber to remove the active species, without removing the adsorbed layer. The species generated in a chlorine plasma can be removed by simply stopping the plasma and allowing the remaining species decay, optionally combined with purging and/or evacuation of the chamber. Purging can be done using any inert gas such as $N_2$, Ar, Ne, He and their combinations.

In operation 308a, an activation gas is delivered to the substrate and an activation source is used to generate activated species from the activation gas, the activated species used to remove the modified surface. In operation 308a, the substrate is exposed to high energy doses of the activated species, which may be delivered by pulsing an energy source such as RF plasma power, bias power, photons, or other energy source to etch the substrate. In some embodiments, more than one high energy dose is provided during operation 308a in one ALE cycle. The high energy dose is provided with an energy greater than the threshold energy to sputter the modified surface and for a duration insufficient to remove the modified surface using a single energy dose. The activation gas may be an inert gas or noble gas, such as argon, helium, neon, krypton, xenon, or combinations thereof. In some embodiments, the energy of a single high energy dose is at least two to at least fifteen times greater than the sputter threshold energy. For example, in some embodiments, for etching silicon using disclosed embodiments, the high energy dose is provided at a bias power of at least 150 eV, or at least 500 eV, or at least 1000 eV, or between 100 eV and about 1500 eV as compared to an example threshold sputter bias power of 65V.

In some embodiments, one or more energy sources are pulsed, while one or more energy sources are delivered continuously. For example, in some embodiments, RF plasma power is continuous while bias power is pulsed. In some embodiments, RF plasma power is pulsed and bias power is pulsed. In some embodiments, RF plasma power is pulsed and bias power is continuous. In various embodiments, where power is pulsed, pulsing may be performed between an ON state and OFF state, or between a low state and high state.

Pulsing conditions for plasma power and bias power, including the frequency and duty cycle, depend on the material to be etched. The below ranges may be used for etching silicon using chlorine as a modification gas. For RF plasma power, when pulsed between ON state and OFF state, the power during the ON state may be between about 50 W and about 900 W. For RF plasma power, when pulsed between a low and high power, the power during high power may be between about 900 W and about 1500 W and the power during low power may be between about 10 W and about 100 W. For bias power, when pulsed between ON state and OFF state, the bias power may be about 10 to about 20 times higher than the bias power for low energy ALE. For etching silicon, the bias power for the ON state may be between about 100V and about 1500V for duty cycles between about 1% and about 10%. For bias power, when pulsed between high power and low power, the bias power for high power may be between about 500V and about 1500V for duty cycles between about 1% and about 10%, and the low power may be between about 100V and about 300V for duty cycles between about 1% and about 10%. In some embodiments, the bias and the RF plasma power are pulsed at least about 100 times during one ALE cycle.

In one example, the following process conditions may be used for etching silicon:

TABLE 1

Example Process Conditions for High Energy ALE of Silicon

| | | Modification | Removal |
|---|---|---|---|
| Plasma Conditions | Gas Chemistry | Chlorine | Argon |
| | Plasma Power | 50-900 W | 0 W to 900 W |
| | Continuous or Pulsed Plasma | Continuous | Pulsed<br>Duty Cycle: 1-10%<br>Frequency: 200 Hz |
| Bias Conditions | Bias Power | 0 V | 0 V to 1500 V |
| | Continuous or Pulsed Bias | No bias | Pulsed Bias<br>Duty Cycle: 1-10%<br>Frequency: 200 Hz<br>Synchronous with Pulsed Plasma |
| Chamber Conditions | Pressure | 5 mTorr-1 Torr | 5 mTorr-200 mTorr |
| | Substrate Temperature | 0°-120° C. | 0° C.-120° C. |

In some embodiments, RF plasma power is continuous while bias power is pulsed between an ON state and OFF state. In some embodiments, RF plasma power is continuous while bias power is pulsed between a high power and low power. In some embodiments, RF plasma power is pulsed between an ON state and OFF state while bias power is pulsed between an ON state and OFF state. In some embodiments, RF plasma power is pulsed between a high power and a low power while bias power is pulsed between an ON state and OFF state. In some embodiments, RF plasma power is pulsed between an ON state and OFF state while bias power is pulsed between a high power and low power. In some embodiments, RF plasma power is pulsed between a high power and a low power while bias power is pulsed between a high power and low power. In some embodiments, the high bias power may be up to the maximum bias power for providing enough energy to remove the modified surface without sputtering, and the low bias power may be as low as the minimum bias power for providing enough energy to remove the modified surface for a given RF plasma power and duty cycle.

In some embodiments, pulsing of RF power and bias power may be synchronized, such that RF power is on when bias power is on, and RF power is off when bias power is off, or RF power is on when bias power is high, and RF power is off when bias power is low, or RF power is high when bias power is on, and RF power is low when bias power is off, or RF power is high when bias power is high, and RF power is low when bias power is low.

In some embodiments, pulsing of RF power and bias power may be asynchronous, such that RF power is off when bias power is on, and RF power is on when bias power is off, or RF power is off when bias power is high, and RF power is on when bias power is low, or RF power is low when bias power is on, and RF power is high when bias power is on, or RF power is low when bias power is high, and RF power is high when bias power is low. In some embodiments, the frequency of pulsing RF power and frequency of pulsing bias power are the same. In some embodiments, the frequency of pulsing RF power and frequency of pulsing bias power are different.

Pulsing may be performed at a pulsing frequency between about 10 Hz and about 200 Hz such as about 200 Hz. The duty cycle of the plasma pulsing for the activation gas may be between about 1% and about 10%. In various embodiments, reducing the duty cycle increases the bias window by range and magnitude, such that a lower duty cycle results in a wider bias window and tolerance of greater bias power applied to the substrate.

For FIG. 3B, in operation 308b, the modified surface is exposed to a high energy energetic particle to etch the modified surface. The energetic particle may have ion energy greater than the average surface binding energy of an underlying unmodified surface of the material to be etched. The high energy energetic particle may be delivered to the substrate in pulses such as described above with respect to operation 308a. In some embodiments, the energetic particle does not significantly sputter the underlying unmodified material. For example, the amount of the underlying unmodified material sputtered during removal by the energetic particle is less than about 10% of the total amount of material removed by the energetic particle in one cycle.

In various embodiments, operation 308b involves exposing the modified surface for a duration which would be insufficient to remove at least 80% of the modified surface if exposed to low ion energy.

In operation 310, the chamber is optionally purged to remove excess activation gas and reaction byproducts from the removal operation of operation 308a or 308b.

In operation 312, operations 304-310 are optionally repeated in cycles. In various embodiments, the modification and removal operations may be repeated in cycles, such as about 1 cycle to about 200 cycles, or about 1 cycle to about 150 cycles, or about 1 cycle to about 70 cycles, or about 1 cycle to about 40 cycles, or about 1 to about 30 cycles, or about 1 to about 20 cycles. Any suitable number of ALE cycles may be included to etch a desired amount of film. In some embodiments, ALE is performed in cycles to etch about 1 Å to about 50 Å of the surface of the layers on the substrate. In some embodiments, cycles of ALE etch between about 2 Å and about 50 Å of the surface of the layers on the substrate.

Examples of various timing schematic diagrams are depicted in FIGS. 4A-4G. For these figures, while RF plasma is depicted as being off during surface modification, in various embodiments plasma is turned on during surface modification. In all of the examples in FIGS. 4A-4G, modification gas is turned on and constant during surface modification, and off during purge phases and removal; removal gas is turned on and constant during removal, and off during purge phases and removal. While not depicted, it will be understood that a carrier gas may be continuously flowed during the etch cycles. In some embodiments, the purge phase gas is the same as the removal gas and the removal gas may thus be turned on during the purge phase while no plasma or bias power is delivered (not shown).

FIG. 4A shows two etch cycles of surface modification, purge, removal, and purge where the bias power is pulsed between ON and OFF during the removal operation while the RF plasma is constant during the removal operation. While only four ON pulses are depicted for the bias power during removal in one ALE cycle, multiple pulses may be used and with various duty cycle, such as between 1% and 10%.

FIG. 4B shows two etch cycles of surface modification, purge, removal, and purge where the bias power is pulsed between low and high power during the removal operation while the RF plasma is constant during the removal operation. While only four high power pulses are depicted for the bias power during removal in one ALE cycle, multiple pulses may be used and with various duty cycle, such as between 1% and 10%.

FIG. 4C shows two etch cycles of surface modification, purge, removal, and purge where the bias power is pulsed between ON and OFF during the removal operation while the RF plasma is also pulsed between ON and OFF during the removal operation. While only four ON pulses are depicted during removal in one ALE cycle, multiple pulses may be used and with various duty cycle, such as between 1% and 10%. In this example, RF pulsing and bias power pulsing are synchronized with the same frequency and duty cycle.

FIG. 4D shows two etch cycles of surface modification, purge, removal, and purge where the bias power is pulsed between high and low power during the removal operation while the RF plasma is also pulsed between ON and OFF during the removal operation. While only four pulses are depicted during removal in one ALE cycle, multiple pulses may be used and with various duty cycle, such as between 1% and 10%. In this example, RF pulsing and bias power pulsing are synchronized with the same frequency and duty cycle.

FIG. 4E shows two etch cycles of surface modification, purge, removal, and purge where the bias power is pulsed between ON and OFF during the removal operation while the RF plasma is also pulsed between high and low powers during the removal operation. While only four pulses are depicted during removal in one ALE cycle, multiple pulses may be used and with various duty cycle, such as between 1% and 10%. In this example, RF pulsing and bias power pulsing are synchronized with the same frequency and duty cycle.

FIG. 4F shows two etch cycles of surface modification, purge, removal, and purge where the bias power is pulsed between high and low powers during the removal operation while the RF plasma is also pulsed between high and low powers during the removal operation. While only four pulses are depicted during removal in one ALE cycle, multiple pulses may be used and with various duty cycle, such as between 1% and 10%. In this example, RF pulsing and bias power pulsing are synchronized with the same frequency and duty cycle.

FIG. 4G shows two etch cycles of surface modification, purge, removal, and purge where the bias power is pulsed between ON and OFF during the removal operation while the RF plasma is also pulsed between ON and OFF during the removal operation. While only four bias power pulses (and only three RF plasma pulses) are depicted during removal in one ALE cycle, multiple pulses may be used and with various duty cycle, such as between 1% and 10%. In this example, RF pulsing and bias power pulsing are asynchronous, such that bias power is on when RF plasma is off and bias power is off when RF plasma is on, but with the same frequency.

FIGS. 4A-4G provide only examples of timing of pulses in various pulsed ALE embodiments. It will be understood that many variations may be used in certain disclosed embodiments of pulsed ALE.

Provided herein are embodiments for achieving etch selectivity. For example, the etch selectivity may depend on the material to be etched, the removal gas and modification gases used, and the bias power used for the pulses during the ON state, such that higher selectivity between two materials may be observed at lower bias power while lower selectivity between two materials may be observed at higher bias power. Since disclosed embodiments expand the bias window for operating self-limiting pulsed ALE, this allows one to tailor the etch selectivity of one material compared to another using a variety of bias powers during pulsed ALE to obtain the desired etch characteristics and, in some embodiments, feature profile.

Apparatus

Inductively coupled plasma (ICP) reactors which, in certain embodiments, may be suitable for atomic layer etching (ALE) operations are now described. Such ICP reactors have also described in U.S. Patent Application Publication No. 2014/0170853, filed Dec. 10, 2013, and titled "IMAGE REVERSAL WITH AHM GAP FILL FOR MULTIPLE PATTERNING," hereby incorporated by reference in its entirety and for all purposes. Although ICP reactors are described herein, in some embodiments, it should be understood that capacitively coupled plasma reactors may also be used. In some embodiments, an electron cyclotron resonance plasma may be used.

Figure 5:
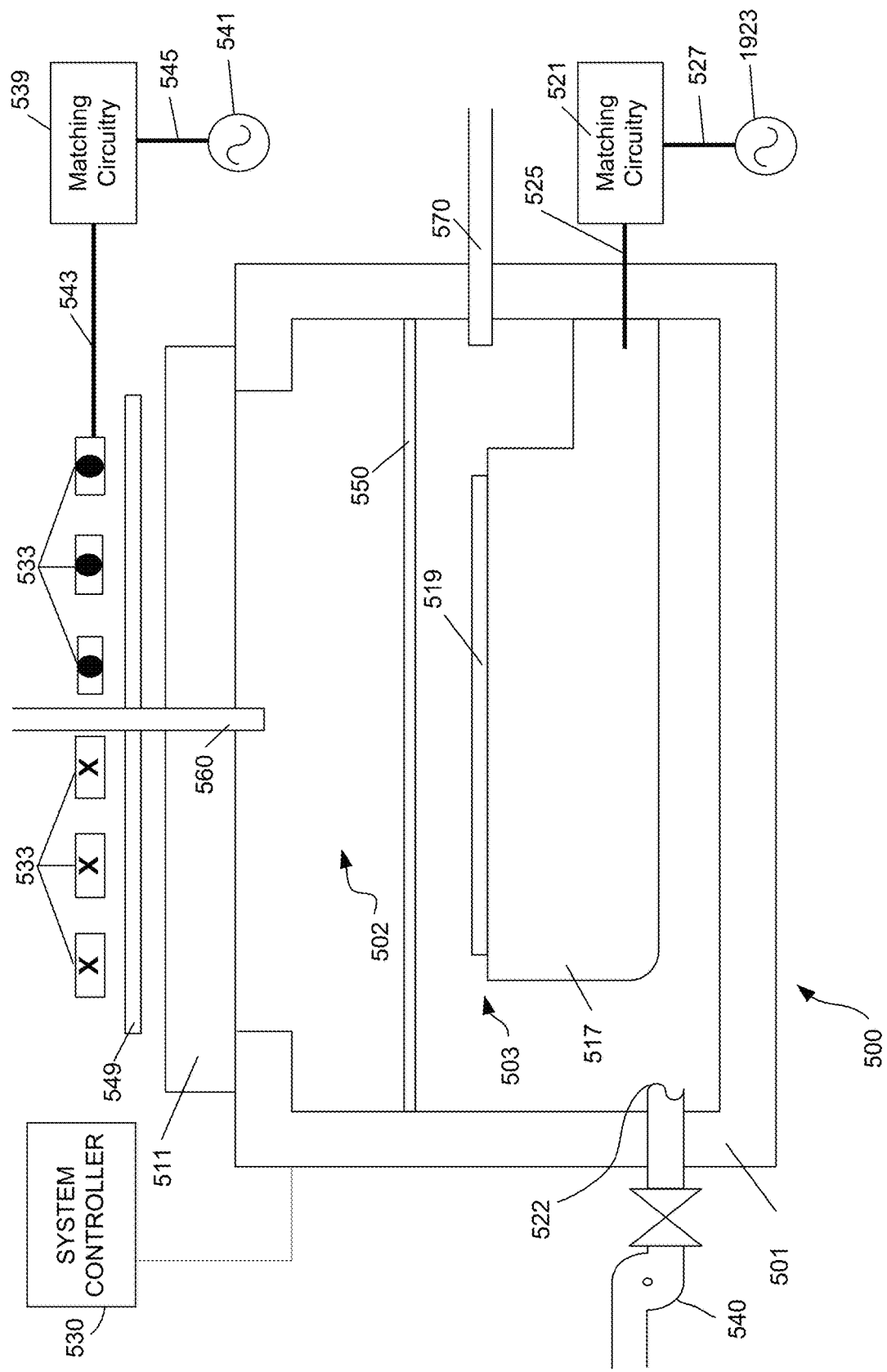
FIG. 5 is a schematic diagram of an example process chamber for performing disclosed embodiments.

FIG. 5 schematically shows a cross-sectional view of an inductively coupled plasma etching apparatus 500 appropriate for implementing certain embodiments herein, an example of which is a Kiyo™ reactor, produced by Lam Research Corp. of Fremont, Calif. The inductively coupled plasma apparatus 500 includes an overall process chamber 501 structurally defined by chamber walls 501 and a window 511. The chamber walls 501 may be fabricated from stainless steel or aluminum. The window 511 may be fabricated from quartz or other dielectric material. An optional internal plasma grid 550 divides the overall processing chamber 501 into an upper sub-chamber 502 and a lower sub-chamber 503. In most embodiments, plasma grid 550 may be removed, thereby utilizing a chamber space made of sub-chambers 502 and 503. A chuck 517 is positioned within the lower sub-chamber 503 near the bottom inner surface. The chuck 517 is configured to receive and hold a semiconductor wafer 519 upon which the etching and deposition processes are performed. The chuck 517 can be an electrostatic chuck for supporting the wafer 519 when present. In some embodiments, an edge ring (not shown) surrounds chuck 517, and has an upper surface that is approximately planar with a top surface of a wafer 519, when present over chuck 517. The chuck 517 also includes electrostatic electrodes for chucking and dechucking the wafer. A filter and DC clamp power supply (not shown) may be provided for this purpose. Other control systems for lifting the wafer 519 off the chuck 517 can also be provided. The chuck 517 can be electrically charged using an RF power supply 523. The RF power supply 523 is connected to matching circuitry 521 through a connection 527. Bias power may be delivered to chuck 517 to bias the substrate. In various embodiments, the bias power may be set to a value between 0V (no bias) and about 2000V, or between 0V and 1800V, or between 0V and 1500V, or between 500V and about 1500V. The matching circuitry 521 is connected to the chuck 517 through a connection 525. In this manner, the RF power supply 523 is connected to the chuck 517.

Elements for plasma generation include a coil 533 is positioned above window 511. In some embodiments, a coil is not used in disclosed embodiments. The coil 533 is fabricated from an electrically conductive material and includes at least one complete turn. The example of a coil 533 shown in FIG. 5 includes three turns. The cross-sections of coil 533 are shown with symbols, and coils having an "X" extend rotationally into the page, while coils having a "•" extend rotationally out of the page. Elements for plasma generation also include an RF power supply 541 configured to supply RF power to the coil 533. In general, the RF power supply 541 is connected to matching circuitry 539 through a connection 545. The matching circuitry 539 is connected to the coil 533 through a connection 543. In this manner, the RF power supply 541 is connected to the coil 533. The RF power supply 541 may be configured to be pulsed at a frequency between 10 Hz and 200 Hz using a duty cycle between 1% and about 20% during the modification operation, and/or pulsed at a frequency between 10 Hz and 200 Hz using a duty cycle between 1% and about 20% during the removal operation for an ALE cycle. An optional Faraday shield 549 is positioned between the coil 533 and the window 511. The Faraday shield 549 is maintained in a spaced apart relationship relative to the coil 533. The Faraday shield 549 is disposed immediately above the window 511. The coil 533, the Faraday shield 549, and the window 511 are each configured to be substantially parallel to one another. The Faraday shield may prevent metal or other species from depositing on the dielectric window of the plasma chamber 501.

Process gases (e.g. chlorine, argon, oxygen, etc.) may be flowed into the processing chamber 501 through one or more main gas flow inlets 560 positioned in the upper chamber 502 and/or through one or more side gas flow inlets 570. Likewise, though not explicitly shown, similar gas flow inlets may be used to supply process gases to a capacitively coupled plasma processing chamber. A vacuum pump, e.g., a one or two stage mechanical dry pump and/or turbomolecular pump 540, may be used to draw process gases out of the process chamber 501 and to maintain a pressure within the process chamber 501. For example, the pump may be used to evacuate the chamber 501 during a purge operation of ALE. A valve-controlled conduit may be used to fluidically connect the vacuum pump to the processing chamber 501 so as to selectively control application of the vacuum environment provided by the vacuum pump. This may be done employing a closed-loop-controlled flow restriction device, such as a throttle valve (not shown) or a pendulum valve (not shown), during operational plasma processing. Likewise, a vacuum pump and valve controlled fluidic connection to the capacitively coupled plasma processing chamber may also be employed.

During operation of the apparatus, one or more process gases may be supplied through the gas flow inlets 560 and/or 570. In certain embodiments, process gas may be supplied only through the main gas flow inlet 560, or only through the side gas flow inlet 570. In some cases, the gas flow inlets shown in the figure may be replaced more complex gas flow inlets, one or more showerheads, for example. The Faraday shield 549 and/or optional grid 550 may include internal channels and holes that allow delivery of process gases to the chamber 501. Either or both of Faraday shield 549 and optional grid 550 may serve as a showerhead for delivery of process gases. In some embodiments, a liquid vaporization and delivery system may be situated upstream of the chamber 501, such that once a liquid reactant or precursor is vaporized, the vaporized reactant or precursor is introduced into the chamber 501 via a gas flow inlet 560 and/or 570. Example liquid precursors include $SiCl_4$ and silicon amides.

Radio frequency power is supplied from the RF power supply 541 to the coil 533 to cause an RF current to flow through the coil 533. The RF current flowing through the coil 533 generates an electromagnetic field about the coil 533. The electromagnetic field generates an inductive current within the upper sub-chamber 502. The physical and chemical interactions of various generated ions and radicals with the wafer 519 selectively etch features of and deposit layers on the wafer.

If the plasma grid is used such that there is both an upper sub-chamber 502 and a lower sub-chamber 503, the inductive current acts on the gas present in the upper sub-chamber 502 to generate an electron-ion plasma in the upper sub-chamber 502. The optional internal plasma grid 550 limits the amount of hot electrons in the lower sub-chamber 503. In some embodiments, the apparatus is designed and operated such that the plasma present in the lower sub-chamber 503 is an ion-ion plasma.

Both the upper electron-ion plasma and the lower ion-ion plasma may contain positive and negative ions, though the ion-ion plasma will have a greater ratio of negative ions to positive ions. Volatile etching and/or deposition byproducts may be removed from the lower sub-chamber 503 through port 522. The chuck 517 disclosed herein may operate at temperatures ranging between about −200° C. and about 600° C. or between about −20° C. and about 250° C. for processing a substrate to etch tantalum, the chuck 517 may be set at a temperature less than about 0° C. The temperature will depend on the process operation and specific recipe and the tool used.

Chamber 501 may be coupled to facilities (not shown) when installed in a clean room or a fabrication facility. Facilities include plumbing that provide processing gases, vacuum, temperature control, and environmental particle control. These facilities are coupled to chamber 501, when installed in the target fabrication facility. Additionally, chamber 501 may be coupled to a transfer chamber that allows robotics to transfer semiconductor wafers into and out of chamber 501 using typical automation.

In some embodiments, a system controller 530 (which may include one or more physical or logical controllers) controls some or all of the operations of a processing chamber. The system controller 530 may include one or more memory devices and one or more processors. In some embodiments, the apparatus includes a switching system for controlling flow rates and durations when disclosed embodiments are performed. In some embodiments, the apparatus may have a switching time of up to about 500 ms, or up to about 750 ms. Switching time may depend on the flow chemistry, recipe chosen, reactor architecture, and other factors.

In some implementations, a controller 530 is part of a system, which may be part of the above-described examples. Such systems can comprise semiconductor processing equipment, including a processing tool or tools, chamber or chambers, a platform or platforms for processing, and/or specific processing components (a wafer substrate support, a gas flow system, etc.). These systems may be integrated with electronics for controlling their operation before, during, and after processing of a semiconductor wafer or substrate. The electronics may be referred to as the "controller," which may control various components or subparts of the system or systems. The controller 530, depending on the processing parameters and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 530 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer. In some embodiments, controller 530 may be used to determine a window for temperature for the modification operation of ALE, or to determine a window for process conditions for the removal operation of ALE, or both.

The controller 530, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 530 receives instructions in the form of data, which specify parameters for each of the processing steps to be performed during one or more operations. It should be understood that the parameters may be specific to the type of process to be performed and the type of tool that the controller is configured to interface with or control. Thus as described above, the controller 530 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an ALD chamber or module, an ALE chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

Figure 6:
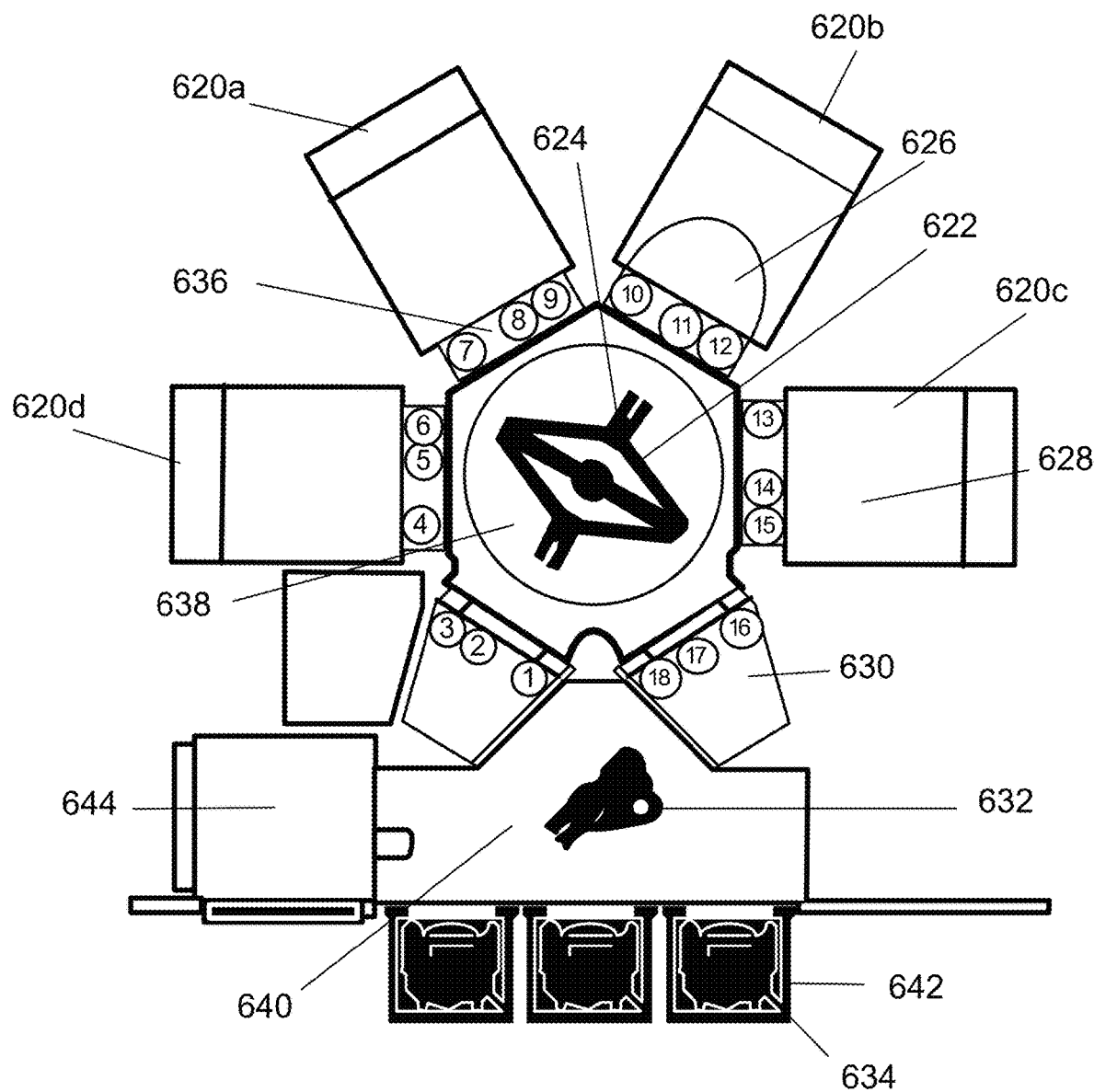
FIG. 6 is a schematic diagram of an example process apparatus for performing disclosed embodiments.

FIG. 6 depicts a semiconductor process cluster architecture with various modules that interface with a vacuum transfer module 638 (VTM). The arrangement of transfer modules to "transfer" wafers among multiple storage facilities and processing modules may be referred to as a "cluster tool architecture" system. Airlock 630, also known as a loadlock or transfer module, is shown in VTM 638 with four processing modules 620a-620d, which may be individual optimized to perform various fabrication processes. By way of example, processing modules 620a-620d may be implemented to perform substrate etching, deposition, ion implantation, wafer cleaning, sputtering, and/or other semiconductor processes. One or more of the substrate etching processing modules (any of 620a-620d) may be implemented as disclosed herein, i.e., for introducing a modification gas, for introducing a removal gas, and other suitable functions in accordance with the disclosed embodiments. Airlock 630 and process module 620 may be referred to as "stations." Each station has a facet 636 that interfaces the station to VTM 638. Inside each facet, sensors 1-18 are used to detect the passing of wafer 626 when moved between respective stations.

Robot 622 transfers wafer 626 between stations. In one embodiment, robot 622 has one arm, and in another embodiment, robot 622 has two arms, where each arm has an end effector 624 to pick wafers such as wafer 626 for transport. Front-end robot 632, in atmospheric transfer module (ATM) 640, is used to transfer wafers 626 from cassette or Front Opening Unified Pod (FOUP) 634 in Load Port Module (LPM) 642 to airlock 630. Module center 628 inside process module 620 is one location for placing wafer 626. Aligner 644 in ATM 640 is used to align wafers.

In an exemplary processing method, a wafer is placed in one of the FOUPs 634 in the LPM 642. Front-end robot 632 transfers the wafer from the FOUP 634 to an aligner 644, which allows the wafer 626 to be properly centered before it is etched or processed. After being aligned, the wafer 626 is moved by the front-end robot 632 into an airlock 630. Because airlock modules have the ability to match the environment between an ATM and a VTM, the wafer 626 is able to move between the two pressure environments without being damaged. From the airlock module 630, the wafer 626 is moved by robot 622 through VTM 638 and into one of the process modules 620a-320d. In order to achieve this wafer movement, the robot 622 uses end effectors 624 on each of its arms. Once the wafer 626 has been processed, it is moved by robot 622 from the process modules 620a-320d to an airlock module 630. From here, the wafer 626 may be moved by the front-end robot 632 to one of the FOUPs 634 or to the aligner 644.

It should be noted that the computer controlling the wafer movement can be local to the cluster architecture, or can be located external to the cluster architecture in the manufacturing floor, or in a remote location and connected to the cluster architecture via a network. A controller as described above with respect to FIG. 5 may be implemented with the tool in FIG. 6.

EXPERIMENTAL

Experiment 1

Figure 7:
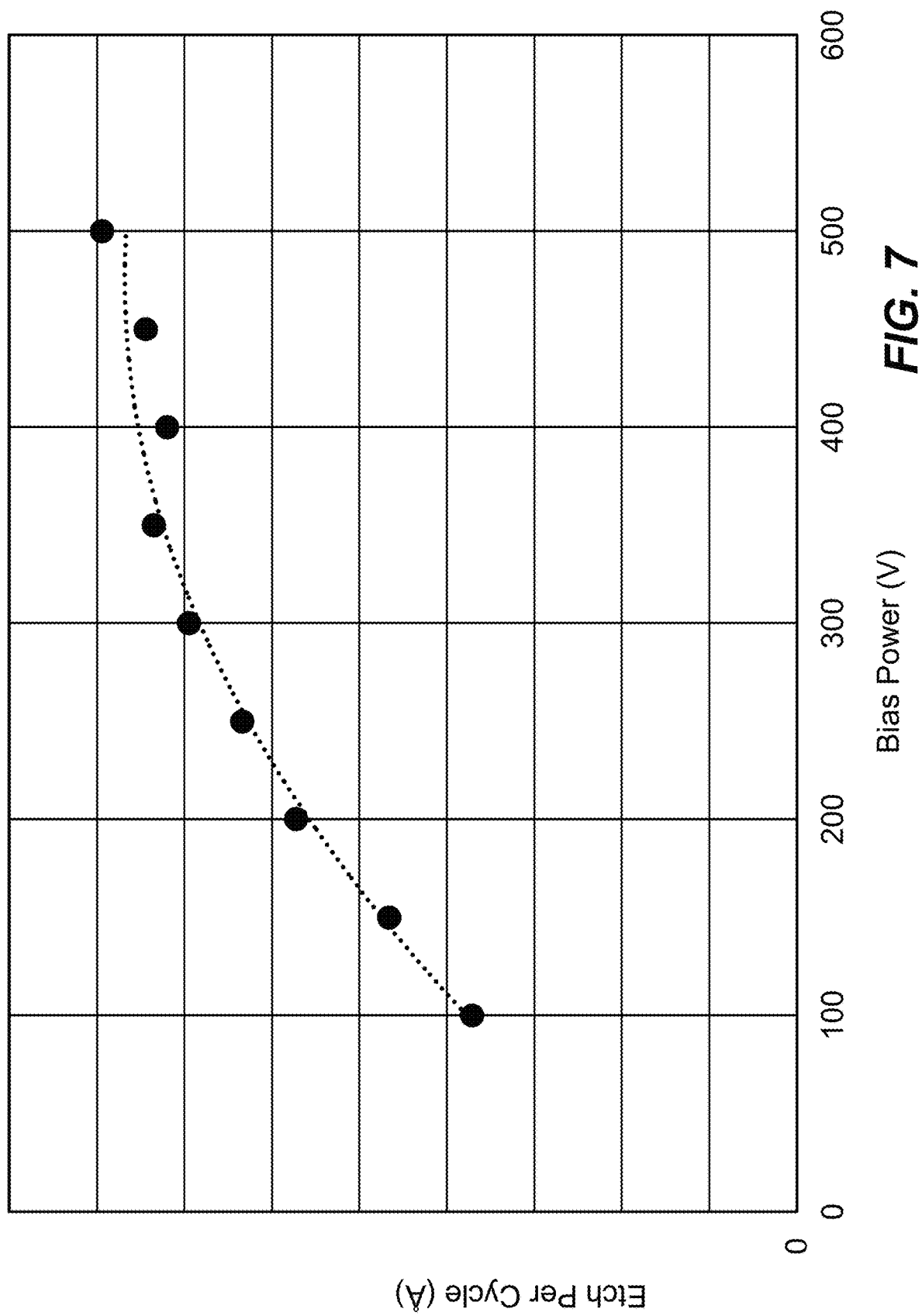
FIG. 7 is a graph of etch per cycle of silicon on insulator as a function of bias power used in pulsed ALE where bias power is pulsed for an experiment conducted in accordance with certain disclosed embodiments.

An experiment was conducted on silicon on insulator material on a substrate by exposing the substrate to 40 cycles of pulsed atomic layer etching, each cycle including: 200 sccm chlorine dose for modification at 40 mTorr, pulsed at 100 Hz frequency; purge using argon; 400 sccm helium flow with 300 W plasma using pulsed bias (ON/OFF) at 100 Hz frequency; purge using argon. The etch per cycle was determined for each trial, each trial using a different bias power for the ON state of the bias ranging from 100 to 500 in 50V increments. The bias power was plotted against etch per cycle in angstroms in FIG. 7, which shows a saturated etch rate with a self-limiting regime at a high bias power between 300V and 500V, which is substantially higher than a self-limiting bias power in continuous ALE. The Y-axis depicted in FIG. 7 is a linear scale.

Experiment 2

Figure 8A:
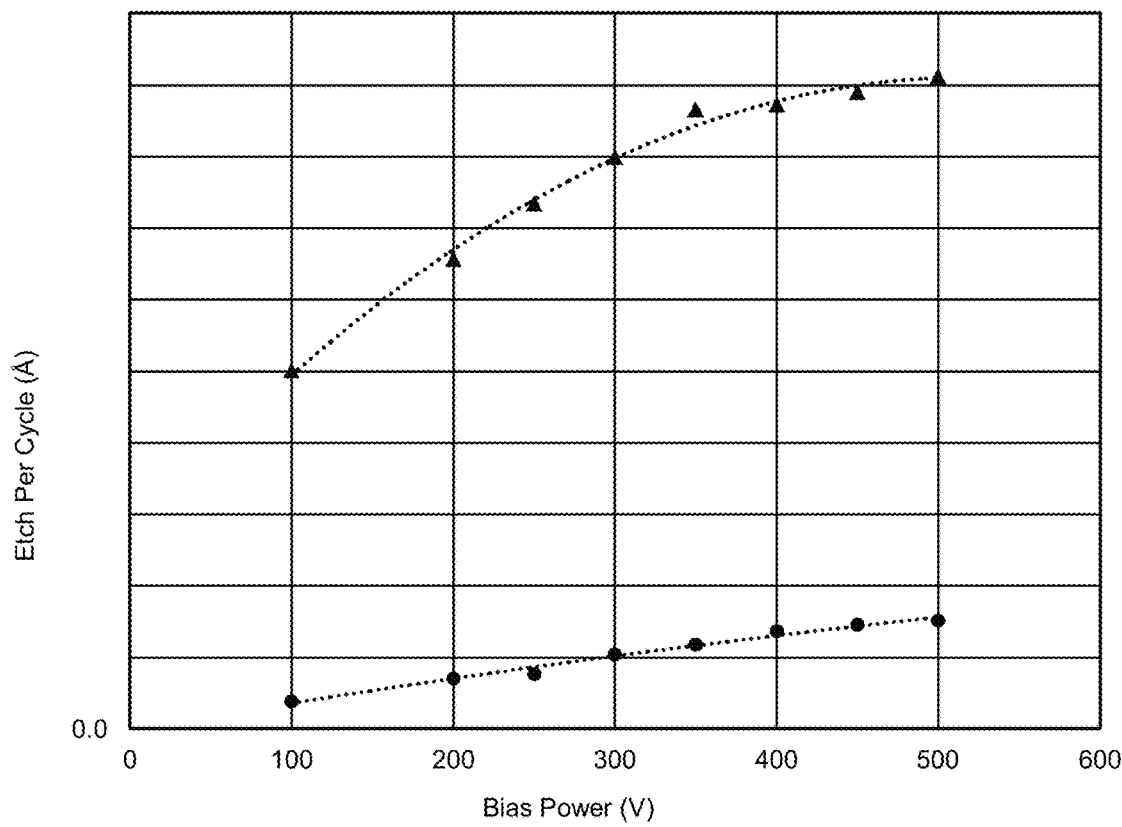
FIG. 8A is a graph of etch per cycle of amorphous silicon and silicon oxide as a function of bias power used in pulsed ALE where bias power is pulsed for an experiment conducted in accordance with certain disclosed embodiments.
Figure 8B:
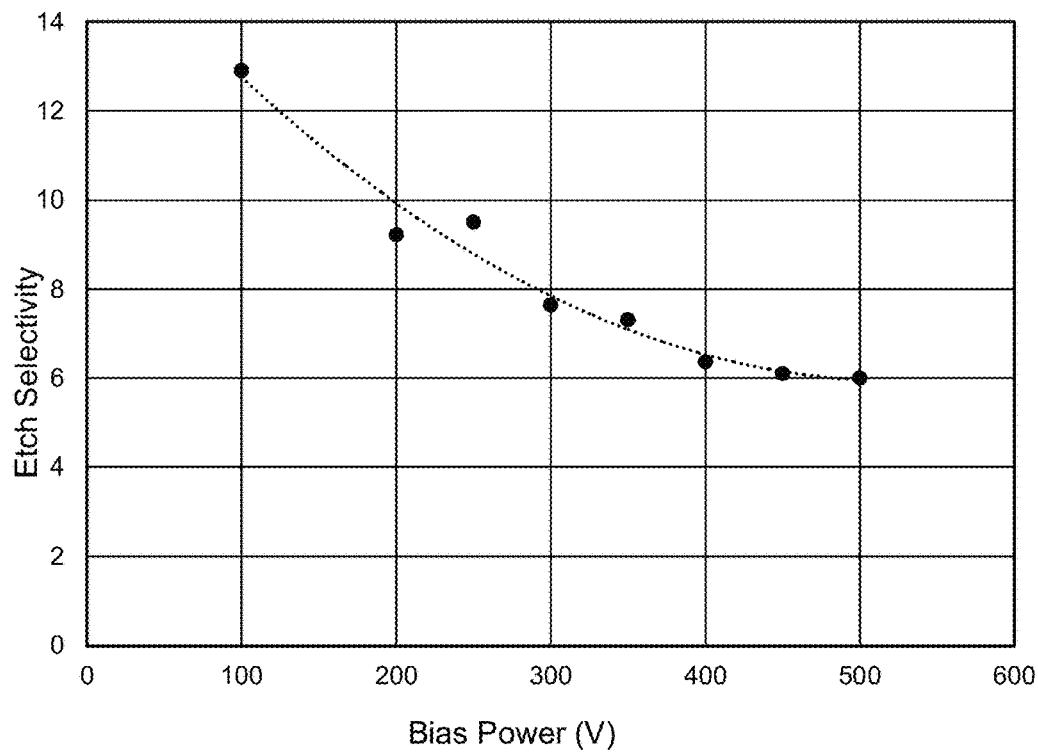
FIG. 8B is a graph of etch selectivity as a function of bias power used in pulsed ALE where bias power is pulsed for the experiment conducted with respect to FIG. 8A.

An experiment was conducted for determining etch per cycle for amorphous silicon and silicon oxide material on a substrate. Both amorphous silicon and silicon oxide were exposed to 70 cycles of pulsed atomic layer etching using helium as the removal gas, each cycle including: 180 sccm chlorine with 180 sccm of helium for modification at 20 mTorr, pulsed at 100 Hz frequency with no bias; purge using helium; 400 sccm helium flow with 0 W plasma power using pulsed bias (ON/OFF) at 100 Hz frequency; purge using helium. The etch per cycle was determined at various bias powers for the ON state of the bias, ranging from 100V to 500V in 100V increments. The bias power was plotted against etch per cycle in angstroms in FIG. 8A, which shows a higher etch per cycle of amorphous silicon (triangles) than of silicon oxide (circles). The Y-axis depicted in FIG. 8A is a linear scale. The etch selectivity of amorphous silicon to silicon oxide was calculated and depicted in FIG. 8B, showing higher selectivity at lower bias power and lower selectivity at high bias power. These results suggest that the broader range of bias power can be tailored to achieve etch selectivity using pulsed ALE.

Experiment 3

Figure 9A:
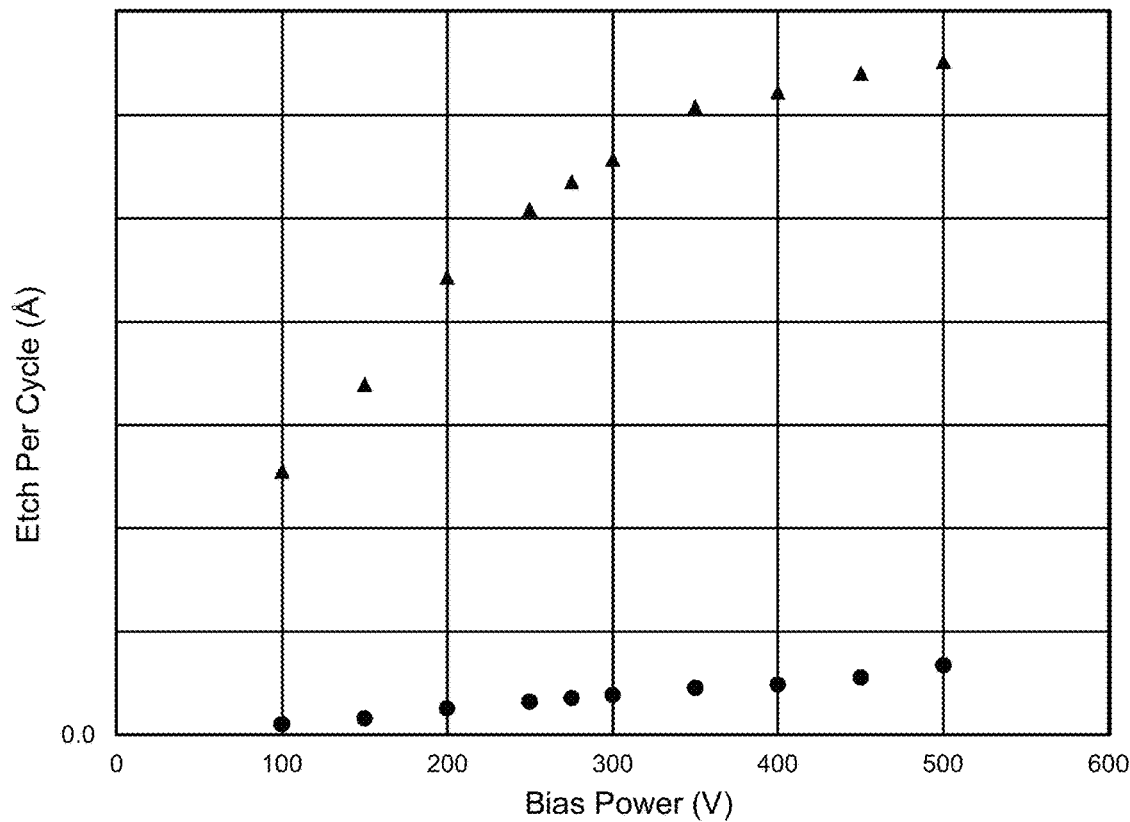
FIG. 9A is a graph of etch per cycle of amorphous silicon and silicon oxide as a function of bias power used in pulsed ALE where bias power is pulsed for an experiment conducted in accordance with certain disclosed embodiments.
Figure 9B:
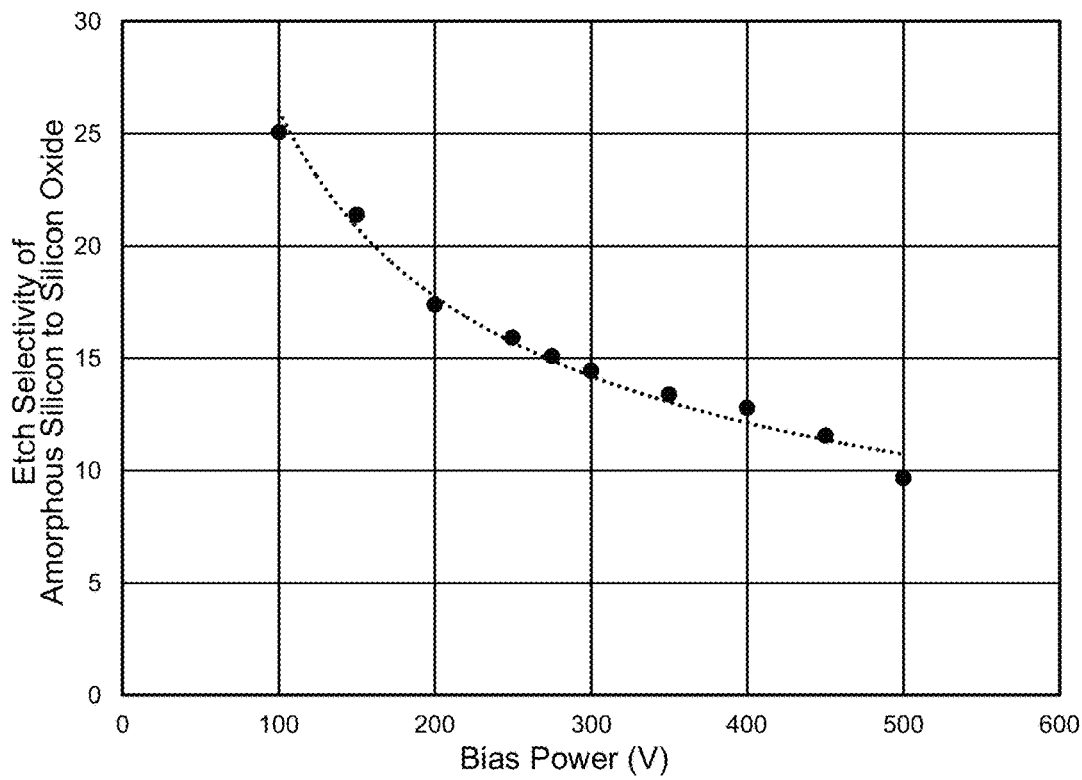
FIG. 9B is a graph of etch selectivity as a function of bias power used in pulsed ALE where bias power is pulsed for the experiment conducted with respect to FIG. 9A.

An experiment was conducted for determining etch per cycle for amorphous silicon and silicon oxide material on a substrate. Both amorphous silicon and silicon oxide were exposed to 200 cycles of pulsed atomic layer etching using argon as the removal gas, each cycle including: 180 sccm chlorine with 180 sccm helium for modification at 20 mTorr, pulsed at 100 Hz frequency with no bias and 200 W plasma power; purge using argon; 400 sccm argon flow with 0 W plasma power using pulsed bias (ON/OFF) at 100 Hz frequency; purge using argon. The etch per cycle was determined at various bias powers for the ON state of the bias, ranging from 200V to 400V in 25V or 50V increments. The bias power was plotted against etch per cycle in angstroms in FIG. 9A, which shows a higher etch per cycle of amorphous silicon (triangles) than of silicon oxide (circles). The Y-axis depicted in FIG. 9A is a linear scale. The etch selectivity of amorphous silicon to silicon oxide was calculated and depicted in FIG. 9B, showing higher selectivity at lower bias power and lower selectivity at high bias power. These results suggest that the broader range of bias power can be tailored to achieve etch selectivity using pulsed ALE.

Experiment 4

Figure 10A:
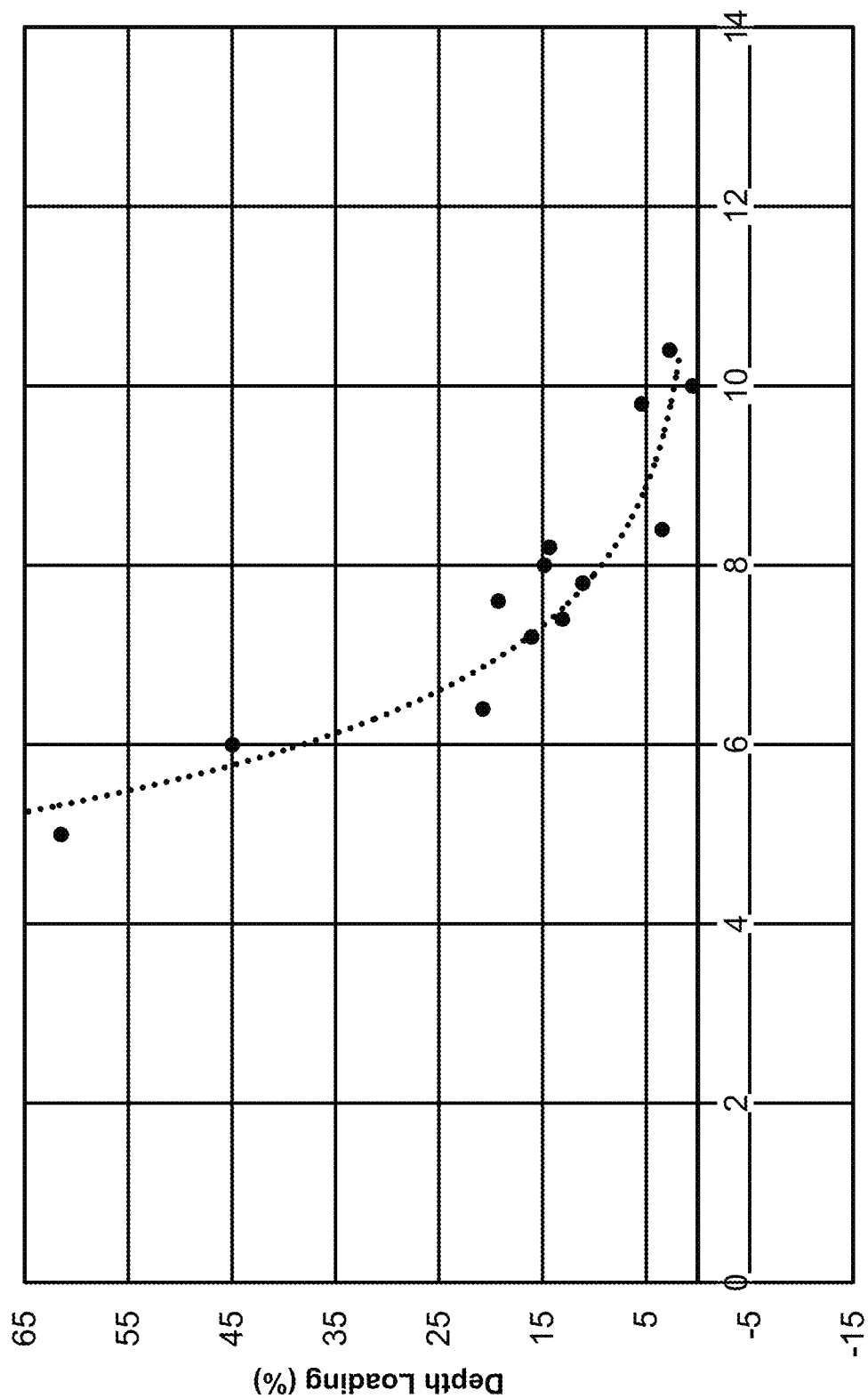
FIGS. 10A and 10B are graphs of pitch loading as a function of trench critical dimension used in pulsed ALE for different bias powers for an experiment conducted in accordance with certain disclosed embodiments.

An experiment was conducted on patterned substrates using pulsed ALE where the removal gas used was helium. The pattern of the substrate included both iso and dense structures, the iso structures having a feature with of 80 nm and the dense structures having a feature with of about 5 nm near the opening of the feature, with feature depths being on the order of 60 nm to 80 nm. The substrate was exposed to multiple cycles of pulsed ALE at a substrate temperature of 120° C., each cycle including: chlorine dose with plasma, purge with helium, helium removal gas exposure with plasma and pulsed bias at 25% duty cycle for 3 seconds per exposure between 0V and 65V bias power, and purge with helium. The pitch loading percent was calculated for various trenches having a range of critical dimensions, and the results are depicted in FIG. 10A. As shown, as trench size increases, pitch loading decreases.

Figure 10B:
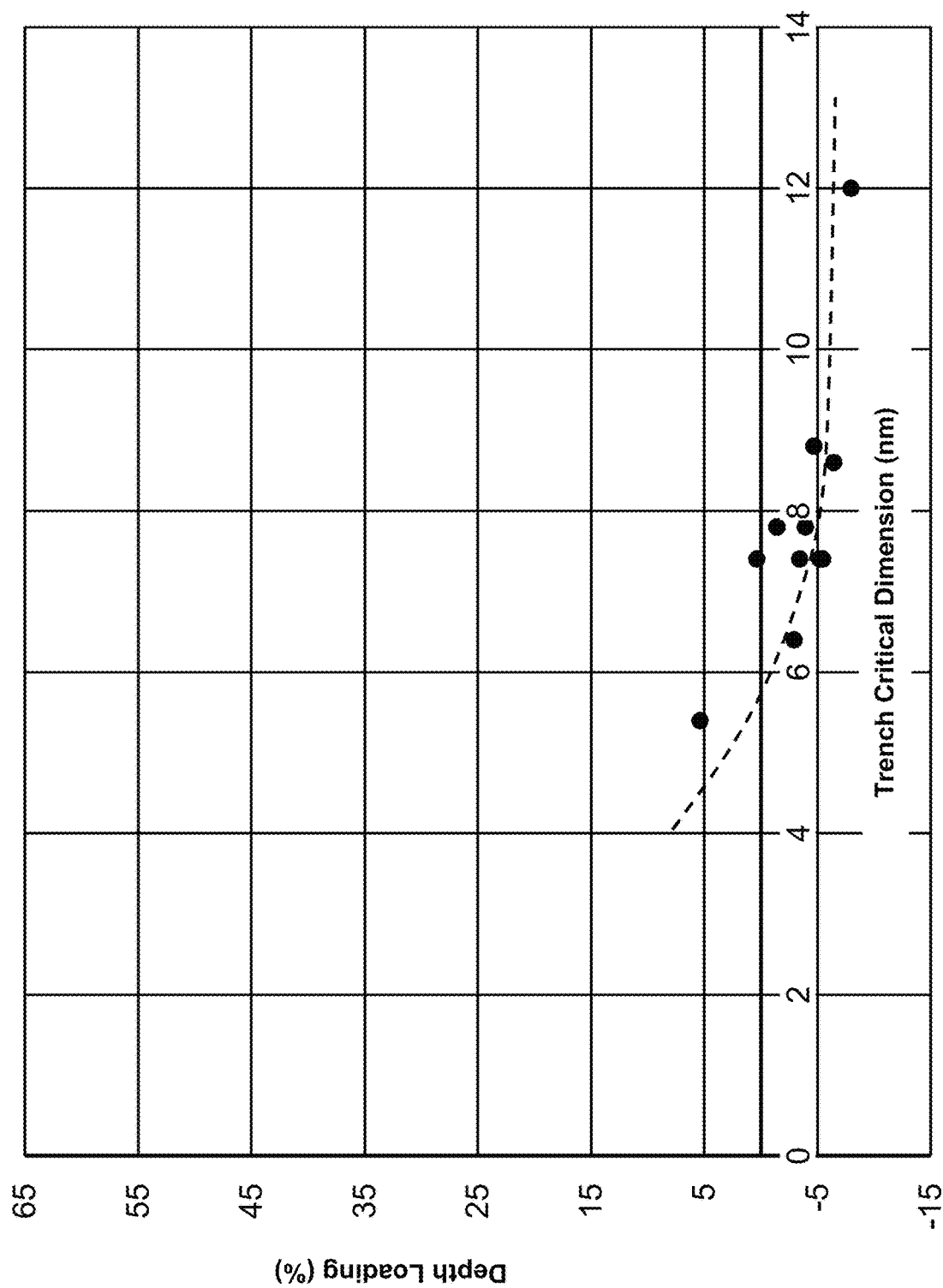

A pattern of similar structure was exposed to multiple cycles of pulsed ALE at a substrate temperature of 120° C., each cycle including: chlorine dose with plasma, purge with helium, helium removal gas exposure with plasma and pulsed bias at 10% duty cycle for 3 seconds per exposure between 0V and 150V bias power, and purge with helium. The pitch loading percent was calculated for various trenches having a range of critical dimensions, and the results are depicted in FIG. 10B. As shown, as trench size increases, pitch loading decreases.

Images of the substrates were generated, which showed that for trenches having a feature opening less than 10 nm, higher helium bias pulsed between 0V and 150V using 10% duty cycle achieved more similar etching depths for each feature across the substrate than substrates exposed to low helium bias pulsed between 0V and 65V using 25% duty cycle.

Experiment 5

Figure 11:
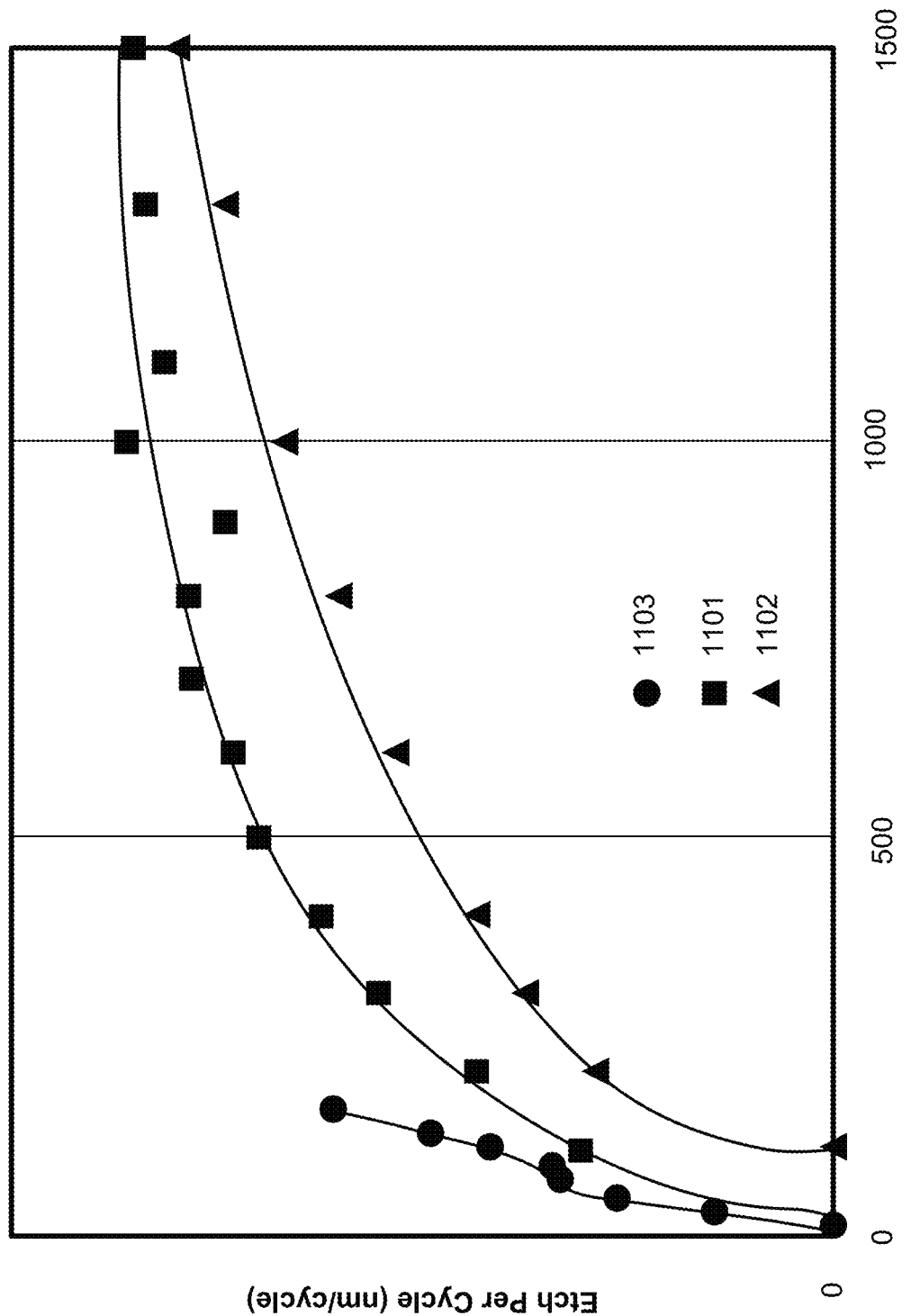
FIG. 11 is a graph depicting etch per cycle of material used pulsed ALE versus ALE without pulsing.

FIG. 11 shows a comparison of etch per cycle vs bias during removal operation for three different curves. Curve 1002 shows an example of etch per cycle when ALE is performed with 3% duty cycle pulsing during the removal operation using a 2-second exposure time. Curve 1101 shows an example of etch per cycle with ALE is performed with 10% duty cycle pulsing during the removal operation using a 2 second exposure time. These are compared with curve 1103 where ALE is performed without pulsing (e.g., duty cycle of 100%) with a 7-second exposure time during removal. As shown, the pulsed embodiments saturate (10% duty cycle saturates at about 900 eV, and 3% duty cycle saturates at about 1500 eV) while the data provided for the non-pulsed embodiment does not have a particular saturation bias voltage.

Experiment 6

FIG. 12A shows an example of experimental data collected for etch per cycle versus bias voltage in continuous exposure during removal. Arrow 1201 shows an example of an ALE window of voltage where etch per cycle is saturated.

FIG. 12B shows an example of etch per cycle versus time in continuous ALE of silicon. In comparison, literature shows that etch amounts for ion beam in an etch reactor as a function of duration of argon exposure involves an increase in etch amount between 100 to 300 seconds of argon exposure, followed by a relatively horizontal slope of etch amount up to about 650 seconds, and a slight increase in some cases for exposure of argon beyond 700 seconds.

Experiment 7

FIG. 13 shows complete removal of ion energy dependent on "ON" time of argon ions.

Figure 14B:
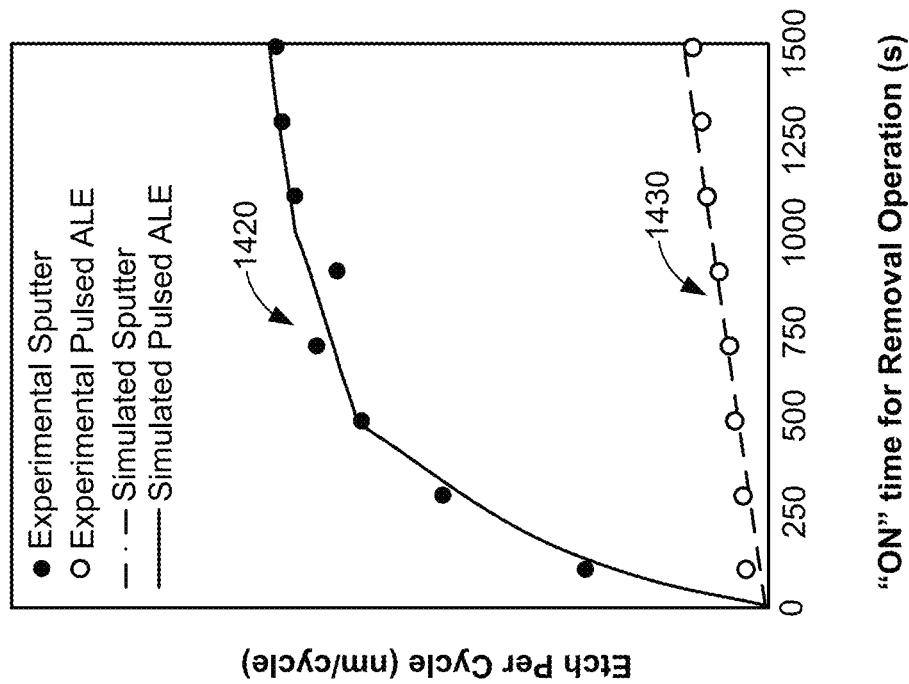
FIG. 14B is a graph of example etch per cycle for "on" times of argon exposure for simulated and experimental data.
Figure 14A:
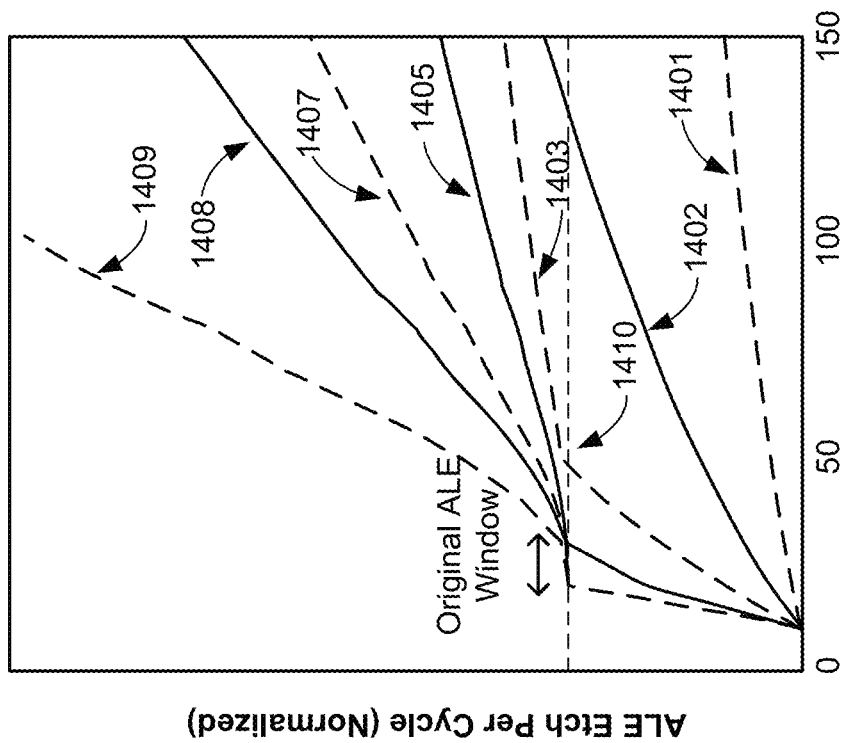
FIG. 14A is an example of normalized etch per cycle for ALE as a function of bias for various "on" times of argon exposure for pulsed ALE.

FIG. 14A shows the ALE window for various ON times on silicon substrate using chlorine as a modification gas and argon as a removal gas, assuming the flux rate is $F=F_0(1+a*V_{bias}/\wedge 1.5)$, where $F_0$ is determined from experimental data. For example, curve 1401 represents the normalized etch per cycle where each pulse is 0.06 seconds, curve 1402 represents the normalized etch per cycle where each pulse is 0.2 seconds, curve 1403 represents the normalized etch per cycle where each pulse is 0.5 seconds, curve 1405 represents the normalized etch per cycle where each pulse is 1 second, curve 1407 represents the normalized etch per cycle where each pulse is 2 seconds, curve 1408 represents the normalized etch per cycle where each pulse is 3 seconds, and curve 1409 represents the normalized etch per cycle where each pulse is 7 seconds. Line 1410 shows the amount at which one layer is etched.

FIG. 14B shows an example fit simulation to data showing the etch per cycle for pulsed ALE that can allow complete removal using the synergistic effect of ALE using certain argon ON times. These results suggest that even at much higher durations of "on" time during removal, pulsed ALE can allow complete removal using a higher etch rate per cycle without substantial sputtering.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of processing a substrate, the method comprising:
    providing a substrate comprising a material to be etched;
    exposing a surface of the material to be etched to a modification gas to modify the surface and form a modified surface in a self-limiting manner; and
    exposing the modified surface to an energetic particle by applying a bias voltage of at least between about 500 V and about 1500 V to preferentially remove the modified surface relative to an underlying unmodified surface.

2. The method of claim 1, wherein ion energy of energetic particle is sufficient to break bonds of the underlying unmodified surface.

3. The method of claim 1, wherein the energetic particle is delivered in temporally separated doses having a duty cycle between about 1% and about 10%.

4. The method of claim 1, wherein the energetic particle removes an amount of the modified surface, and the amount of the removed modified surface is given by an equation $$\theta(t) = 1 - \exp\left(\frac{-Y \cdot F \cdot t}{d}\right)$$

wherein Y is ion yield of the energetic particle, F is flux of energetic particle, t is duration of the exposing of the modified surface to the energetic particle, and d is surface density of material to be etched.

5. The method of claim 1, wherein the energetic particle does not significantly sputter underlying unmodified material.

6. The method of claim 4, wherein the modified surface is exposed to the energetic particle for a duration is sufficient to remove the modified surface in a self-limited manner.

7. A method of processing a substrate, the method comprising:
    providing a substrate comprising a material to be etched;
    exposing a surface of the material to be etched to a modification gas to modify the surface and form a modified surface; and
    exposing the modified surface to an attenuated dose of energetic particles,
    wherein a dose without attenuation has an energy greater than a surface binding energy for the material to be etched when delivered continuously to the modified surface.

8. The method of claim 7, wherein the dose is attenuated by varying ion flux of the energetic particles.

9. The method of claim 7, wherein the dose is attenuated by varying duration of the modified surface being exposed to the energetic particles.

10. The method of claim 7, wherein the attenuated dose comprises two or more temporally separated pulses of the energetic particles to the modified surface to remove the at least some of the modified surface.

11. The method of claim 7, wherein the dose is attenuated by varying acceleration of ions in the energetic particles to the modified surface.

12. The method of claim 7, wherein the dose is attenuated by varying bias voltage applied to a substrate support holding the substrate for directionally delivering the energetic particles to the modified surface.

13. A method of processing a substrate, the method comprising:
    exposing the substrate to a modification gas to modify a surface of the substrate to form a modified surface;
    exposing the modified surface of the substrate to a removal gas; and
    providing a plurality of temporally separated pulses of energy generated from an activation source during the exposing the modified surface to the removal gas to remove at least some of the modified surface from the substrate, wherein voltage applied to bias the substrate is pulsed using a duty cycle between about 1% and about 20%.

14. The method of claim 13, further comprising repeating exposing the substrate to the modification gas and exposing the modified surface to the removal gas in two or more cycles, wherein the plurality of temporally separated pulses of energy is provided during the exposing the modified surface to the removal gas in each cycle.

15. The method of claim 14, wherein the plurality of temporally separated pulses of energy comprises at least 100 temporally separated pulses of energy per cycle.

16. The method of claim 13, wherein the temporally separated pulses of energy is sufficient to remove the modified surface and insufficient to physically sputter the modified surface.

17. The method of claim 13, wherein the energy provided is defined by a bias window of a minimum voltage applied to the substrate during the exposing of the modified surface to the removal gas sufficient to remove the modified surface, and a maximum voltage applied to the substrate during the exposing of the modified surface to the removal gas insufficient to sputter the modified surface.

18. The method of claim 13, wherein the activation source comprises two or more sources.

19. The method of claim 13, wherein the activation source is selected from the group consisting of radio frequency plasma, bias applied to the substrate, ultraviolet radiation, photons, and combinations thereof.

20. The method of claim 13, wherein the activation source comprises voltage applied to bias the substrate.

21. The method of claim 20, wherein the voltage is at least between about 500 V and about 1500 V.

22. The method of claim 13, wherein the activation source comprises radio frequency plasma.

* * * * *